(12) United States Patent
Fukuchi et al.

(10) Patent No.: US 7,883,912 B2
(45) Date of Patent: Feb. 8, 2011

(54) DISPLAY DEVICE AND METHOD FOR MANUFACTURING THE SAME

(75) Inventors: Kunihiko Fukuchi, Gifu (JP); Gen Fujii, Kanagawa (JP); Osamu Nakamura, Kanagawa (JP); Shinji Maekawa, Shizuoka (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 12/552,305

(22) Filed: Sep. 2, 2009

(65) Prior Publication Data

US 2009/0325333 A1    Dec. 31, 2009

Related U.S. Application Data

(62) Division of application No. 10/576,819, filed as application No. PCT/JP2004/016813 on Nov. 5, 2004, now Pat. No. 7,601,994.

(30) Foreign Application Priority Data

Nov. 14, 2003    (JP) .............................. 2003-386030

(51) Int. Cl.
H01L 21/00    (2006.01)
(52) U.S. Cl. .............................. 438/24; 438/48; 438/67; 438/77; 438/149; 257/E31.083
(58) Field of Classification Search .................. 438/24, 438/48, 67, 77, 149
See application file for complete search history.

(56) References Cited

U.S. PATENT DOCUMENTS

| | | | |
|---|---|---|---|
| 5,747,930 A | 5/1998 | Utsugi | |
| 5,920,082 A | 7/1999 | Kitazawa et al. | |
| 6,265,730 B1 | 7/2001 | Nakanishi et al. | |
| 6,387,737 B1 | 5/2002 | Yamazaki et al. | |
| 6,420,834 B2 | 7/2002 | Yamazaki et al. | |
| 6,503,772 B1 * | 1/2003 | Ohtsu et al. | 438/30 |
| 6,645,807 B2 | 11/2003 | Tsuzumitani et al. | |
| 6,806,495 B1 | 10/2004 | Yamazaki et al. | |
| 6,830,494 B1 | 12/2004 | Yamazaki et al. | |
| 6,872,586 B2 * | 3/2005 | Kiguchi et al. | 438/28 |

(Continued)

FOREIGN PATENT DOCUMENTS

EP    0 684 753 A1    11/1995

(Continued)

OTHER PUBLICATIONS

Chinese Office Action (Application No. 200480040429.8; PCTCN7504) Dated Feb. 22, 2008 with English translation.

(Continued)

*Primary Examiner*—Wai-Sing Louie
(74) *Attorney, Agent, or Firm*—Nixon Peabody LLP; Jeffrey L. Costellia

(57) ABSTRACT

According to one aspect of the present invention, at least one or more of patterns required for manufacturing a display device, such as a conductive layer which forms a wiring or an electrode and a mask, is formed by a droplet discharging method. At that time, a portion of the gate insulating film where is not located under the semiconductor layer is removed during manufacturing steps of the present invention.

15 Claims, 30 Drawing Sheets

U.S. PATENT DOCUMENTS

| | | |
|---|---|---|
| 6,909,477 B1 * | 6/2005 | Yi et al. .................. 349/106 |
| 2003/0008429 A1 | 1/2003 | Yamazaki et al. |
| 2003/0010283 A1 | 1/2003 | Yamazaki et al. |
| 2003/0025118 A1 | 2/2003 | Yamazaki et al. |
| 2003/0040150 A1 | 2/2003 | Yamazaki et al. |
| 2003/0227253 A1 | 12/2003 | Seo et al. |
| 2003/0232128 A1 | 12/2003 | Furusawa et al. |
| 2003/0235935 A1 | 12/2003 | Yamazaki et al. |
| 2004/0077113 A1 | 4/2004 | Yamazaki et al. |
| 2004/0145692 A1 | 7/2004 | Yamazaki et al. |
| 2004/0147113 A1 | 7/2004 | Yamazaki et al. |
| 2004/0218136 A1 | 11/2004 | Imai |
| 2004/0224433 A1 | 11/2004 | Yamazaki et al. |
| 2004/0253896 A1 | 12/2004 | Yamazaki |
| 2004/0266073 A1 | 12/2004 | Yamazaki |
| 2005/0011752 A1 | 1/2005 | Yamazaki et al. |
| 2005/0013927 A1 | 1/2005 | Yamazaki |
| 2005/0014319 A1 | 1/2005 | Yamazaki et al. |
| 2005/0026410 A1 | 2/2005 | Yamazaki et al. |
| 2005/0037614 A1 | 2/2005 | Fukuchi |
| 2005/0043186 A1 | 2/2005 | Maekawa et al. |
| 2005/0048289 A1 | 3/2005 | Muranaka et al. |
| 2005/0064091 A1 | 3/2005 | Yamazaki |
| 2005/0090029 A1 | 4/2005 | Yamazaki et al. |
| 2005/0095356 A1 | 5/2005 | Nakamura et al. |
| 2005/0101064 A1 | 5/2005 | Yamazaki et al. |
| 2005/0112906 A1 | 5/2005 | Maekawa et al. |
| 2005/0121675 A1 | 6/2005 | Maekawa et al. |
| 2005/0122351 A1 | 6/2005 | Yamazaki et al. |
| 2007/0075322 A1 | 4/2007 | Nakamura et al. |

FOREIGN PATENT DOCUMENTS

| | | |
|---|---|---|
| EP | 1 357 772 A2 | 10/2003 |
| JP | 1-120068 | 5/1989 |
| JP | 07-094752 | 4/1995 |
| JP | 07-312290 A | 11/1995 |
| JP | 07-333652 A | 12/1995 |
| JP | 10-221702 | 8/1998 |
| JP | 10-253983 | 9/1998 |
| JP | 11-326951 A | 11/1999 |
| JP | 2001-196590 A | 7/2001 |
| JP | 2001-250953 A | 9/2001 |
| JP | 2003-058077 A | 2/2003 |
| JP | 2003-315813 | 11/2003 |
| JP | 2003-318193 | 11/2003 |

OTHER PUBLICATIONS

International Search Report for PCT/JP2004/016813 dated Mar. 8, 2005.

Written Opinion of the International Searching Authority for PCT/JP2004/016813 dated Mar. 8, 2005.

* cited by examiner

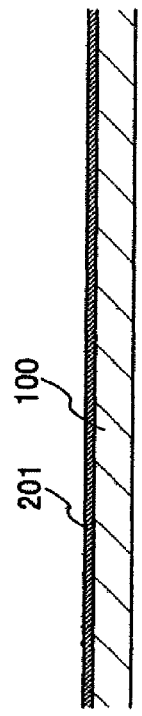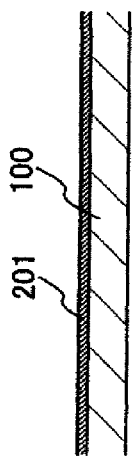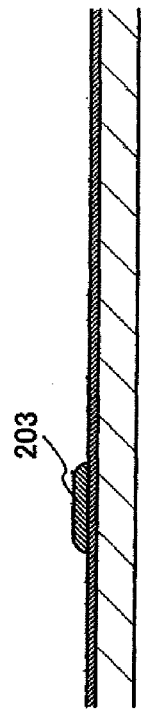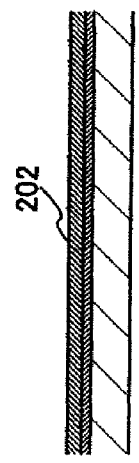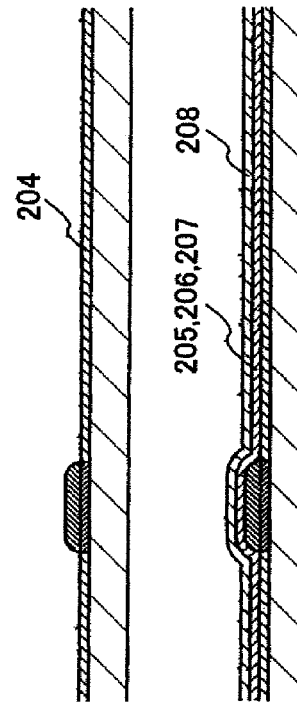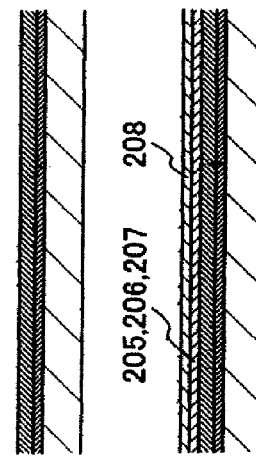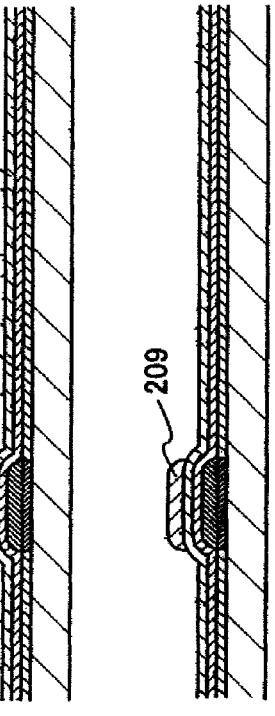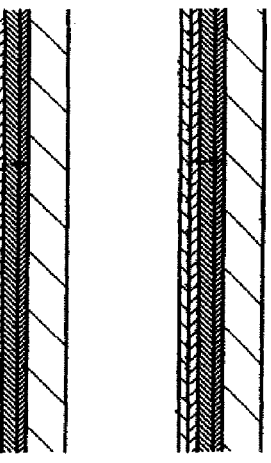

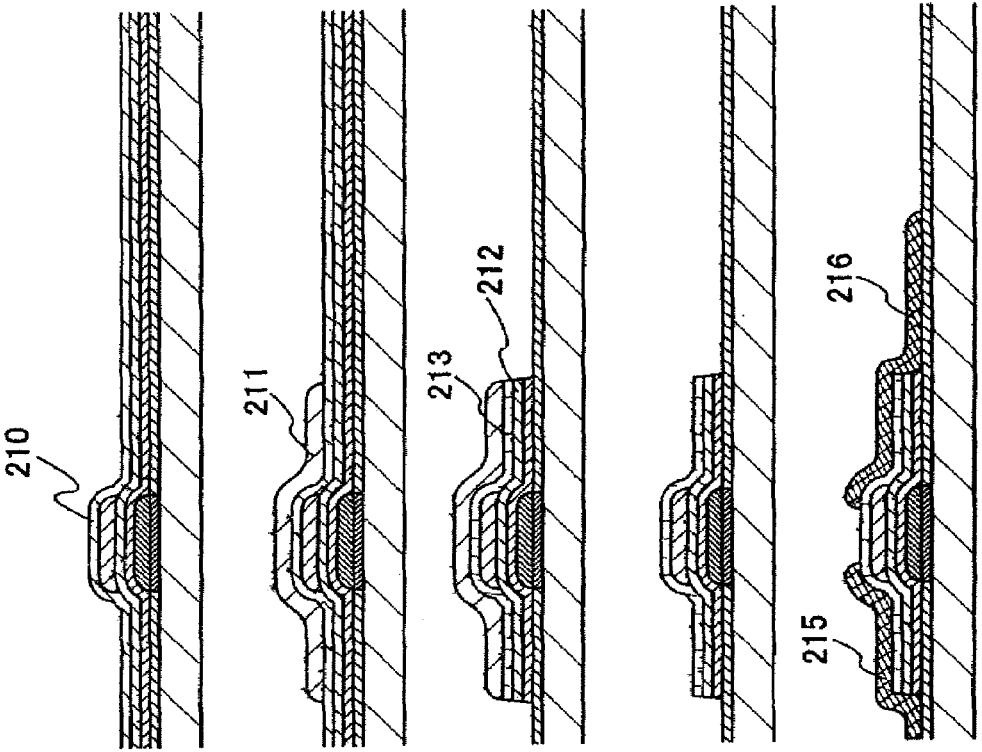

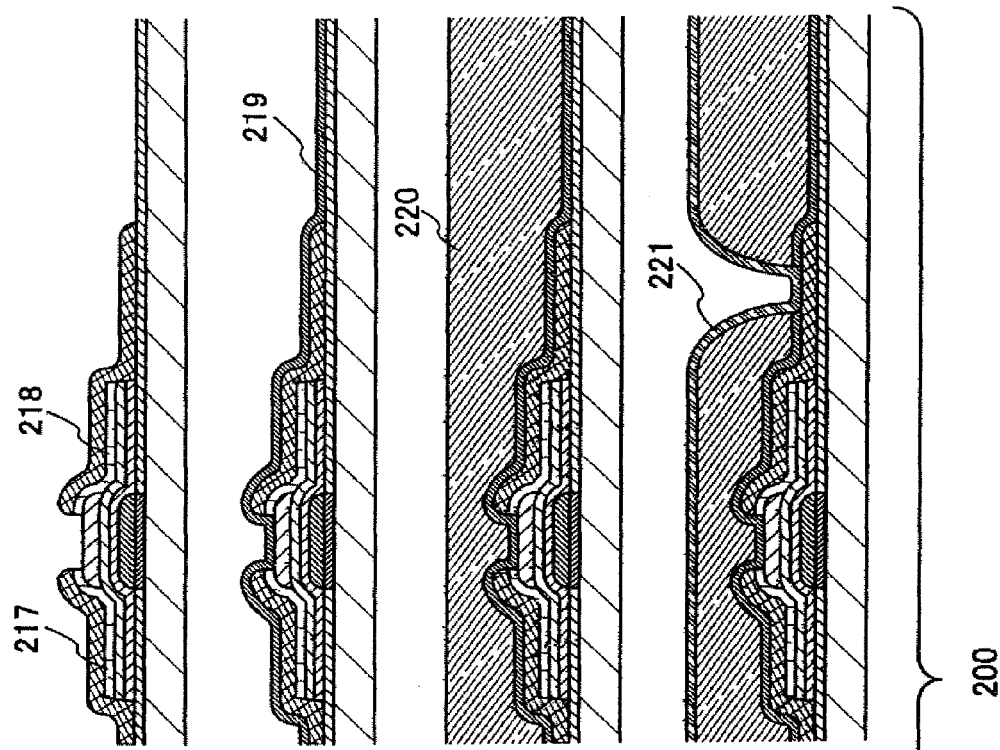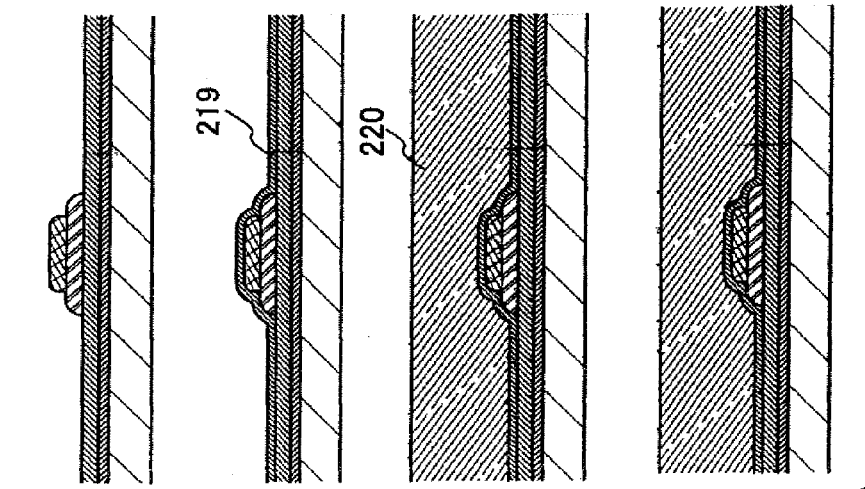

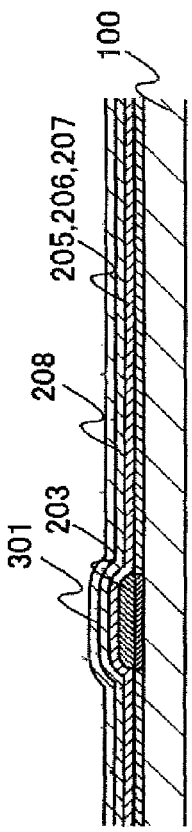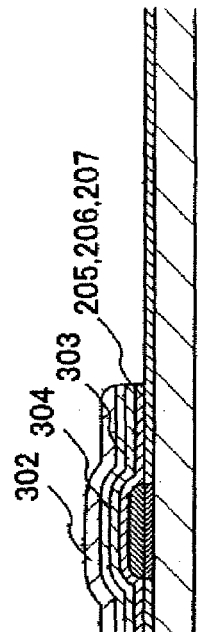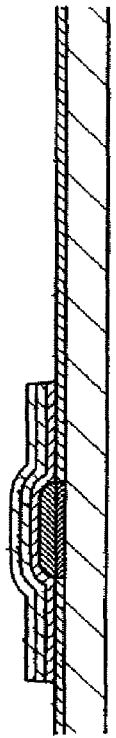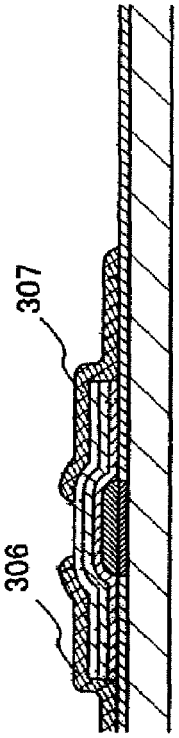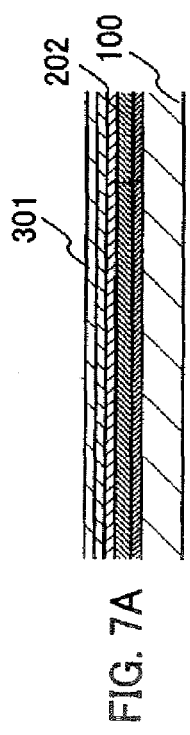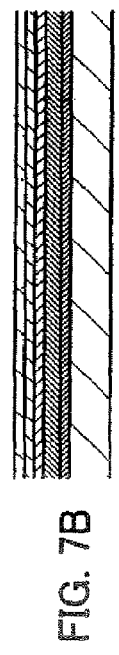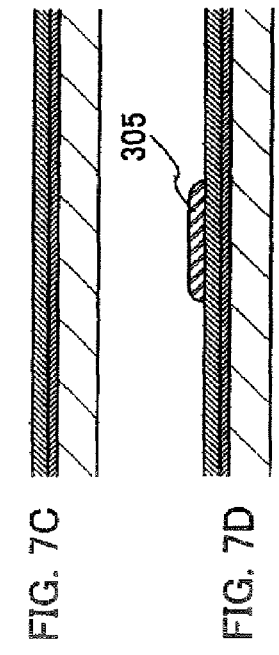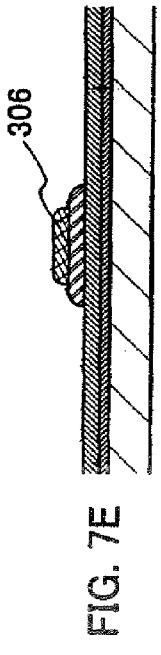

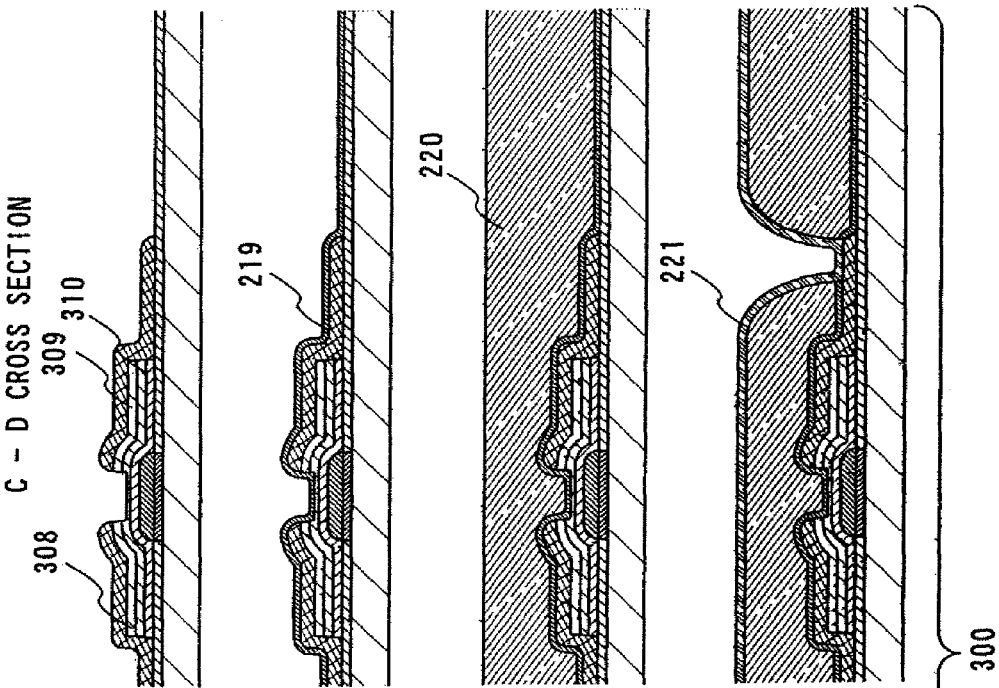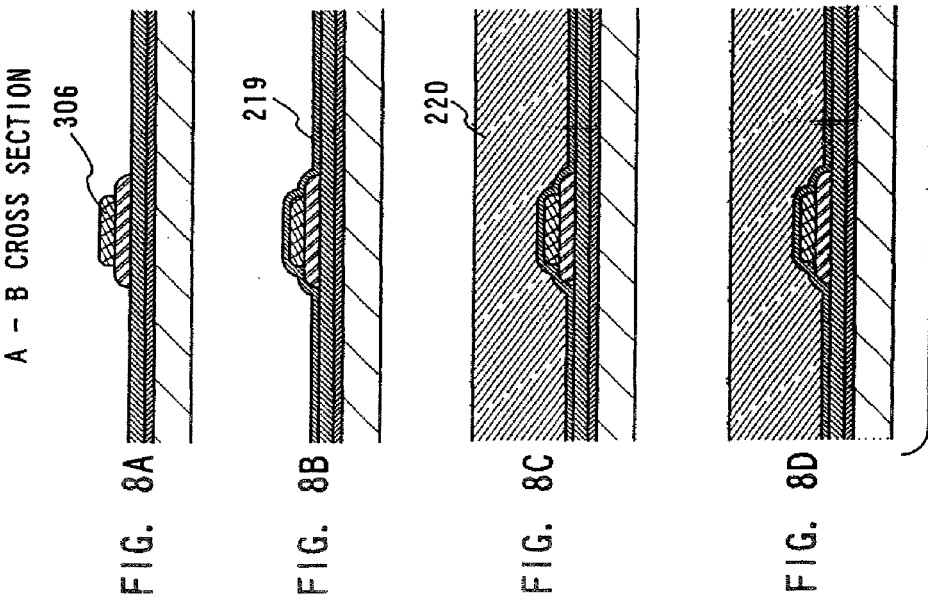

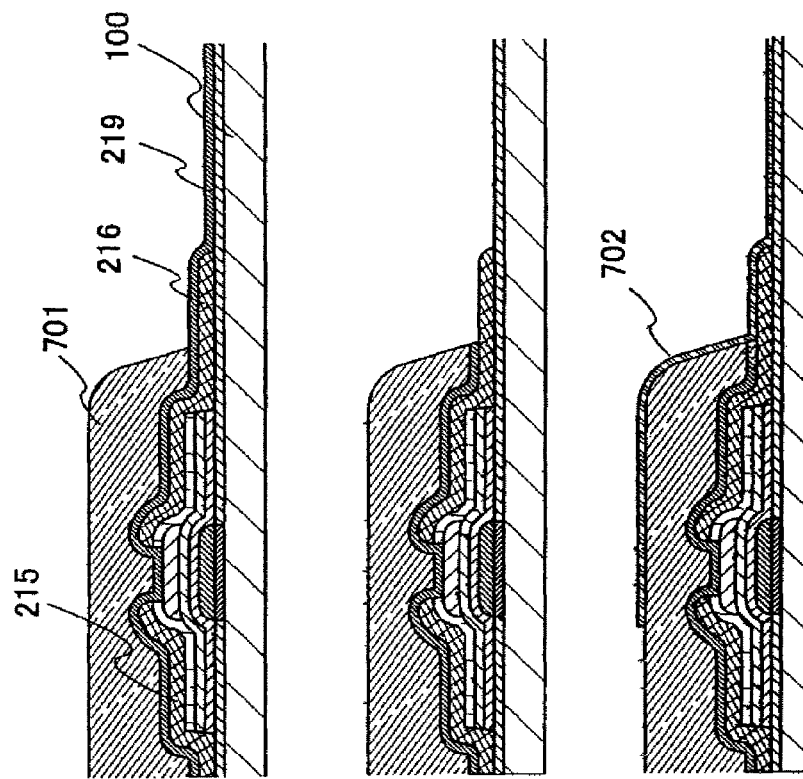
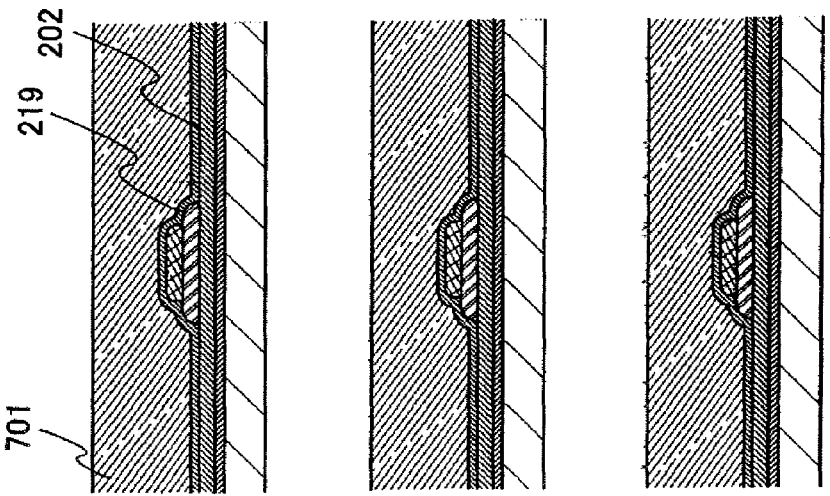

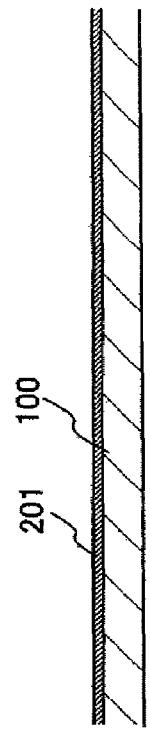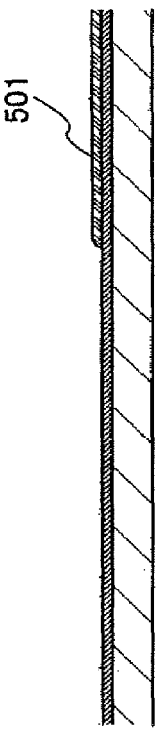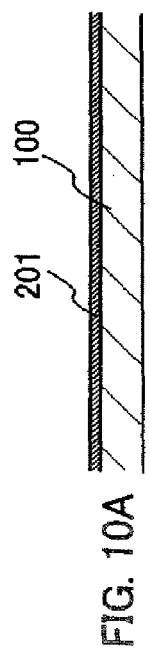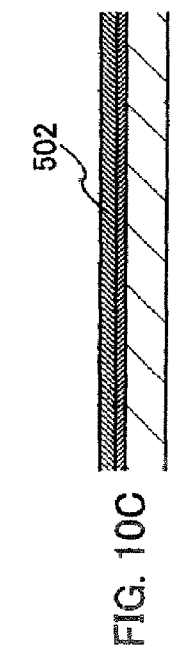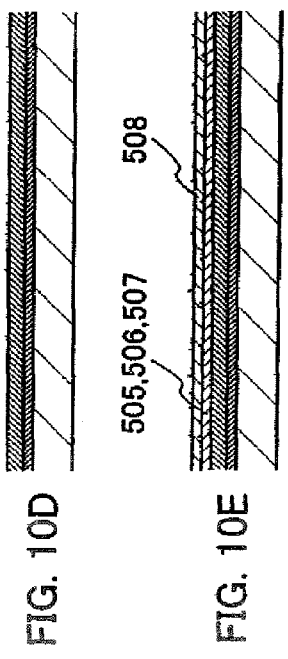

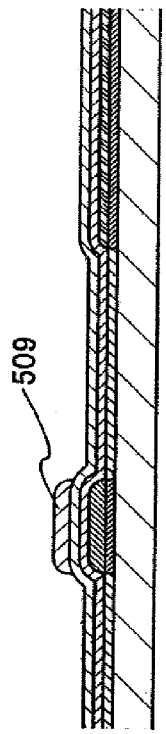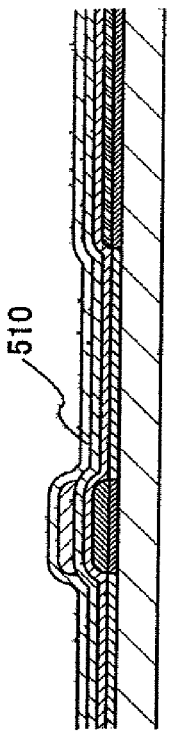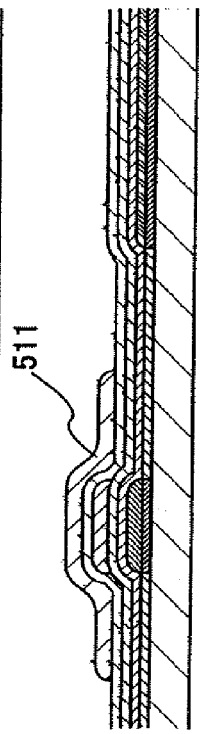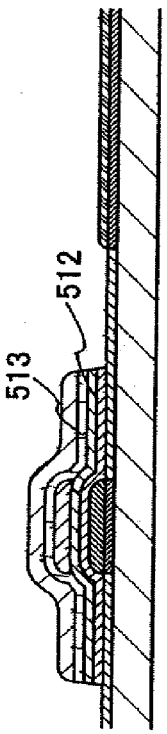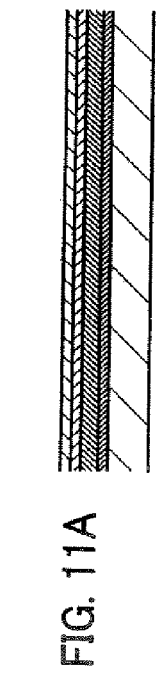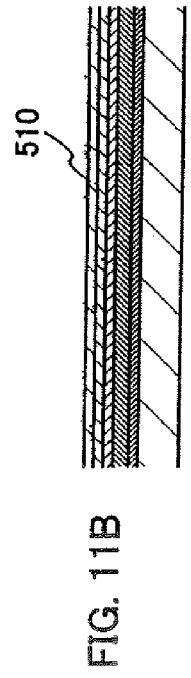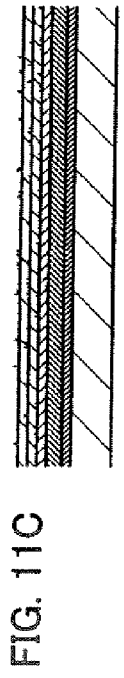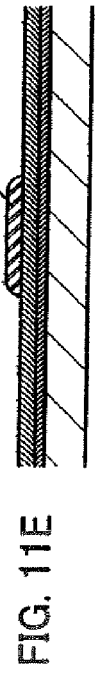
FIG. 11A  FIG. 11B  FIG. 11C  FIG. 11D  FIG. 11E

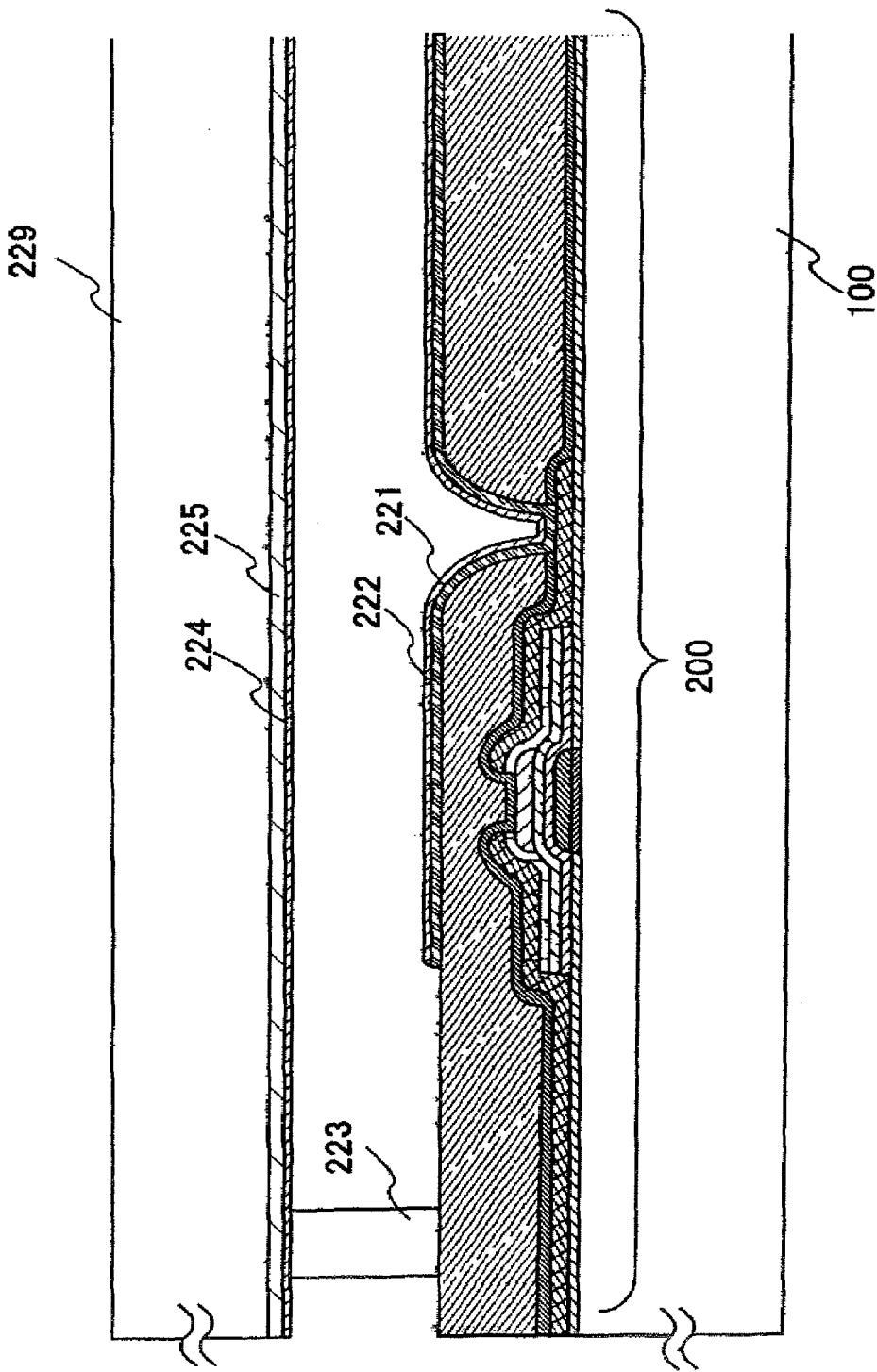

DISPLAY DEVICE AND METHOD FOR MANUFACTURING THE SAME

TECHNICAL FIELD

The present invention relates to a display device including an active element such as a transistor formed over a glass substrate and to a method for manufacturing the same.

BACKGROUND ART

Conventionally, an active matrix drive liquid crystal display device comprising a thin film transistor formed over a glass substrate has been manufactured by patterning various thin films by light exposure using photomasks as with a technology for manufacturing a semiconductor integrated circuits.

However, as the size of a glass substrate used for manufacturing such a liquid crystal display device becomes larger, it has become difficult to manufacture a display panel with high productivity at low cost by a conventional patterning method. Accordingly, even though a display panel corresponding to a large substrate is formed by consecutive exposure or the like, the processing time is increased by multiple exposure treatments. Further, huge investment is required to develop a light exposure apparatus which can handle such a larger substrate.

Further, as a substrate size becomes larger, higher material costs are spent, and a large amount of wastes such as liquid waste are required to be processed in the case of a manufacturing method in which various thin films are formed entirely over a substrate surface and are thereafter etched away so that only required parts remain.

DISCLOSURE OF INVENTION

The invention was made in view of the above problems. It is an object of the invention to provide a display device which can be manufactured by a simplified manufacturing process by which the material efficiency is improved. It is a further object of the invention to provide a manufacturing method of the display device.

According to one aspect of the present invention, by selectively forming a pattern, at least one or more of patterns required for manufacturing a display device, such as a conductive layer which forms a wiring or an electrode and a mask layer for forming a predetermined pattern, is formed and at that time, a portion of the gate insulating film where is not located under the semiconductor layer is removed. A droplet discharge method is used for selectively forming a predetermined pattern by selectively discharging a droplet of a composition from fine holes. Further, screen printing technology or off-set printing technology may be used.

A method for manufacturing a display device according to the invention includes: a first step of forming a gate electrode by a droplet discharge method over a substrate which has an insulating surface or has a base surface pretreated; a second step of forming a gate insulating layer over the gate electrode and forming a first semiconductor layer over the gate insulating layer; a third step of selectively forming a channel protective layer by a droplet discharge method over an area which is overlapped with the gate electrode over the first semiconductor layer; a fourth step of forming a second semiconductor layer containing an impurity having one conductivity type over the gate insulating layer, the first semiconductor layer, and the channel protective layer; a fifth step of selectively forming a first mask layer over the second semiconductor layer; a sixth step of etching the second semiconductor layer, the first semiconductor layer thereunder, and the gate insulating film with the use of the first mask layer; a seventh step of selectively forming a first insulating layer by a droplet discharge method over the gate electrode; an eighth step of selectively forming source and drain wirings by a droplet discharge method; a ninth step of etching the second insulating layer over the channel protective layer; a tenth step of forming a passivation film over the entire surface of the substrate; an eleventh step of forming a second insulating layer by a droplet discharge method over the entire substrate of the passivation film; a twelfth step of etching the passivation film over the drain wiring; and a thirteenth step of forming a transparent conductive film over the second insulating layer so as to connect to the drain wiring. In the eleventh step, the second insulating layer is selectively formed by a droplet discharge method over the entire surface of the substrate except an area where the drain wiring is connected with the transparent conductive film.

A method for manufacturing a display device according to the invention includes: a first step of forming a gate electrode by a droplet discharge method over a substrate which has an insulating surface or has a base film; a second step of forming a gate insulating layer over the gate electrode and forming a first semiconductor layer over the gate insulating layer; a third step of selectively forming a channel protective layer by a droplet discharge method over an area which is overlapped with the gate electrode over the first semiconductor layer; a fourth step of forming a second semiconductor layer containing an impurity having one conductivity type over the gate insulating layer, the first semiconductor layer, and the channel protective layer; a fifth step of selectively forming a first mask layer over the second semiconductor layer; a sixth step of etching the second semiconductor layer, the first semiconductor layer thereunder, and the gate insulating film with the use of the first mask layer; a seventh step of selectively forming a first insulating layer by a droplet discharge method over the gate electrode; an eighth step of selectively forming source and drain wirings by a droplet discharge method; a ninth step of etching the second insulating layer over the channel protective layer with the use of the source and drain wirings as masks; a tenth step of forming a passivation film over the entire surface of the substrate; an eleventh step of forming a second insulating layer by a droplet discharge method over the entire surface of the passivation film; a twelfth step of etching the passivation film over the drain wiring with the use of the second insulating layer as a mask; and a thirteenth step of forming a transparent conductive film over the second insulating layer so as to connect to the drain wiring. In the eleventh step, the second insulating layer is selectively formed by a droplet discharge method over the entire surface of the substrate except an area where the drain wiring is connected with the transparent conductive film.

In the above-mentioned second step, it is preferable to successively form each layer of the gate insulating layer and the first semiconductor layer without exposure to the atmosphere by plasma enhanced vapor phase growth (plasma CVD) or by sputtering.

A first silicon nitride film, a silicon oxide film, and a second silicon nitride film are sequentially formed in layers to form a gate insulating film; thus, the gate electrode can be prevented from being oxidized. Further a preferable interface between the gate insulating film and the semiconductor layer formed on the upper side of the gate insulating film can be obtained.

As mentioned above, according to the other aspect of the invention, the gate electrode, the wiring, and the mask used during patterning are formed by a method for selectively forming a pattern. However, at least one or more of patterns necessary for manufacturing a display device may be formed by a droplet discharge method or the like which can selectively form a pattern to manufacture a liquid crystal display device, thereby achieving the object.

A display device according to the invention includes a pixel electrode connected to the thin film transistor. The thin film transistor has a gate electrode provided over one of substrates; an island shape gate insulating film including at least one of a silicon nitride layer, a silicon oxynitride layer, and a silicon oxide layer, which is in contact with the gate electrode; a semiconductor layer; and source and drain wirings formed of a conductive material, which is connected to the semiconductor layer. Further, an end of the semiconductor layer is provided so as not to protrude from an end of the gate insulating layer. In the thin film transistor, the gate electrode, the island shape gate insulating film, the semiconductor layer, and the source and drain wirings are laminated in order from the substrate side.

A display device according to the invention includes a pixel electrode connected to the thin film transistor. The thin film transistor has a gate electrode provided over one of substrates; an island shape gate insulating film including at least one of a silicon nitride layer, a silicon oxynitride layer, and a silicon oxide layer, which is in contact with the gate electrode; a semiconductor layer; and source and drain wirings formed of a conductive material, which is connected to the semiconductor layer. Further, an end of the semiconductor layer is provided so as to coincide with an end of the gate insulating layer.

A display device according to the invention includes a pixel electrode connected to the thin film transistor. The thin film transistor has a gate electrode provided over one of substrates; an island shape gate insulating film including at least one of a silicon nitride layer, a silicon oxynitride layer, and a silicon oxide layer, which is in contact with the gate electrode; a semiconductor layer; source and drain wirings formed of a conductive material, which is connected to the semiconductor layer; and a silicon nitride layer or a silicon oxynitride layer which is in contact with the source and drain wirings. Further, an end of the semiconductor layer is provided so as not to protrude from an end of the gate insulating layer.

A display device according to the invention includes a pixel electrode connected to the thin film transistor. The thin film transistor has a gate electrode provided over one of substrates; an island shape gate insulating film including at least one of a silicon nitride layer, a silicon oxynitride layer, and a silicon oxide layer, which is in contact with the gate electrode; a semiconductor layer; source and drain wirings formed of a conductive material, which is connected to the semiconductor layer; and a silicon nitride layer or a silicon oxynitride layer which is in contact with the source and drain wirings. Further, an end of the semiconductor layer is provided so as to coincide with an end of the gate insulating layer.

A display device according to the invention includes: a first thin film transistor having a gate electrode provided over one of substrates; an island shape gate insulating film including at least one of a silicon nitride layer, a silicon oxynitride layer, and a silicon oxide layer, which is in contact with the gate electrode; a semiconductor layer; and source and drain wirings formed of a conductive material, which is connected to the semiconductor layer; a pixel electrode connected to the first thin film transistor, and a driving circuit having a second thin film transistor formed to have the same structure as the first thin film transistor; and a wiring layer which is extended from the driver circuit and connected to the gate electrode of the first thin film transistor. Here, an end of the semiconductor layer of a pixel area or the driver circuit area may be provided so as not to protrude from an end of the gate insulating layer.

A display device according to the invention includes: a first thin film transistor having a gate electrode provided over one of substrates; an island shape gate insulating film including at least one of a silicon nitride layer, a silicon oxynitride layer, and a silicon oxide layer, which is in contact with the gate electrode; a semiconductor layer; and source and drain wirings formed of a conductive material, which is connected to the semiconductor layer; a pixel electrode connected to the first thin film transistor, and a driving circuit having a second thin film transistor formed to have the same structure as the first thin film transistor; and a wiring layer which is extended from the driver circuit and connected to the gate electrode of the first thin film transistor. Here, an end of the semiconductor layer may be provided so as to coincide with an end of the gate insulating layer.

A display device according to the invention includes: a first thin film transistor having a gate electrode provided over one of substrates; an island shape gate insulating film including at least one of a silicon nitride layer, a silicon oxynitride layer, and a silicon oxide layer, which is in contact with the gate electrode; a semiconductor layer; and source and drain wirings formed of a conductive material, which is connected to the semiconductor layer; a silicon nitride layer or a silicon oxynitride layer which is in contact with the source and drain wirings; a pixel electrode connected to the first thin film transistor, and a driving circuit having a second thin film transistor formed to have the same structure as the first thin film transistor; and a wiring layer which is extended from the driver circuit and connected to the gate electrode of the first thin film transistor. Here, an end of the semiconductor layer of a pixel area or the driver circuit area may be provided so as not to protrude from an end of the gate insulating layer.

A display device according to the invention includes: a first thin film transistor having a gate electrode provided over one of substrates; an island shape gate insulating film including at least one of a silicon nitride layer, a silicon oxynitride layer, and a silicon oxide layer, which is in contact with the gate electrode; a semiconductor layer; and source and drain wirings formed of a conductive material, which is connected to the semiconductor layer; a silicon nitride layer or a silicon oxynitride layer which is in contact with the source and drain wirings; a pixel electrode connected to the first thin film transistor, and a driving circuit having a second thin film transistor formed to have the same structure as the first thin film transistor; and a wiring layer which is extended from the driver circuit and connected to the gate electrode of the first thin film transistor. Here, an end of the semiconductor layer is provided so as to coincide with an end of the gate insulating layer.

According to the invention, the display device is a liquid crystal display device and the substrates sandwich liquid crystal materials.

According to the invention, a gate electrode or a wiring can be formed from a conductive material by selectively forming a pattern. Ag or an alloy containing Ag; particles of Cu coated with NiB, Ag, or a laminate thereof; or the like may be used as the conductive material. The gate electrode or the wiring can be prevented from being oxidized by providing a silicon nitride film or a silicon oxynitride film thereon.

According to the invention, a semiconductor layer that is a main component of a thin film transistor may be formed of an amorphous semiconductor (hereinafter also referred to as AS), a semiamorphous semiconductor (also referred to as microcrystal, hereinafter also referred to as SAS), or the like which is formed by vapor phase growth or sputtering using a semiconductor material gas typified by silane and germanium may be used.

An SAS is a semiconductor with an intermediate structure between an amorphous and a crystal structure (including a single crystal and a polycrystal). This is a semiconductor having a third condition that is stable as a case of a free energy, and a crystalline region having a short distance order and lattice distortion is included therein. A crystalline region of from 0.5 nm to 20 nm can be observed at least in a part of region in the film. When silicon is contained as the main component, Raman spectrum is shifted to a lower frequency side less than 520 $cm^{-1}$. Diffraction peak of (111) or (220) to be caused from a crystal lattice of silicon is observed in X-ray diffraction. At least 1 atomic % or more of hydrogen or halogen is contained as a neutralizer of a dangling bond. An SAS is formed by carrying out grow discharge decomposition (plasma CVD) on a silicide gas. In addition to $SiH_4$, $Si_2H_6$, $SiH_2Cl_2$, $SiHCl_3$, $SiCl_4$, $SiF_4$, or the like can be used for the silicide gas. In addition, $GeF_4$ may be mixed. This silicide gas may be diluted with $H_2$ or $H_2$ and one or more of the rare gas element of He, Ar, Kr, and Ne. A dilution ratio ranges from 2 times to 1000 times. A pressure ranges approximately from 0.1 Pa to 133 Pa, and a power frequency ranges from 1 MHz to 120 MHz, preferably from 13 MHz to 60 MHz. A substrate heating temperature may be 300° C. or less. It is desirable that an atmospheric constituent impurity such as oxygen, nitrogen, or carbon is $1\times10^{20}$ $atoms/cm^3$ or less as an impurity element in the film, specifically an oxygen concentration is $5\times10^{19}$ $atoms/cm^3$ or less, preferably $1\times10^{19}$ $atoms/cm^3$ or less.

A driver circuit which is formed with only n-channel thin film transistors can be provided by using a SAS. Thus, a driver circuit can be formed over one substrate by using a thin film transistor which can be operated at an electric field effect mobility of from 1 $cm^2/V \cdot sec$ to 15 $cm^2/V \cdot sec$.

According to the present invention, patterning of a wiring or a mask can be carried out directly by a droplet discharge method or the like; therefore, a thin film transistor in which material efficiency of a material is expected to be improved and a manufacturing step is simplified, and a liquid crystal display device using the thin film transistor can be obtained.

Further, the gate insulating film is not formed except the area under the semiconductor layer; thus, TFTs are easily connected with each other with a wiring. If TFTs are formed from a polycrystalline semiconductor or a microcrystalline silicon semiconductor with high field effect mobility, various circuits such as a scan line driver circuit can easily be mounted on a substrate by the same process as a pixel TFT.

BRIEF DESCRIPTION OF DRAWINGS

FIGS. 4A to 4E are cross-sectional views explaining a manufacturing method of a liquid crystal display device.

FIGS. 5A to 5E are cross-sectional views explaining a manufacturing method of a liquid crystal display device.

FIGS. 6A to 6D are cross-sectional views explaining a manufacturing method of a liquid crystal display device.

FIGS. 7A to 7E are cross-sectional views explaining a manufacturing method of a liquid crystal display device.

FIGS. 5A to 8D are cross-sectional views explaining a manufacturing method of a liquid crystal display device.

FIGS. 9A to 9C are cross-sectional views explaining a manufacturing method of a liquid crystal display device.

FIGS. 10A to 10E are cross-sectional views explaining a manufacturing method of a liquid crystal display device.

FIGS. 11A to 11E are cross-sectional views explaining a manufacturing method of a liquid crystal display device.

FIG. 13 is a cross-sectional view explaining a manufacturing method of a liquid crystal display device.

BEST MODE FOR CARRYING OUT THE INVENTION

Figure 1:
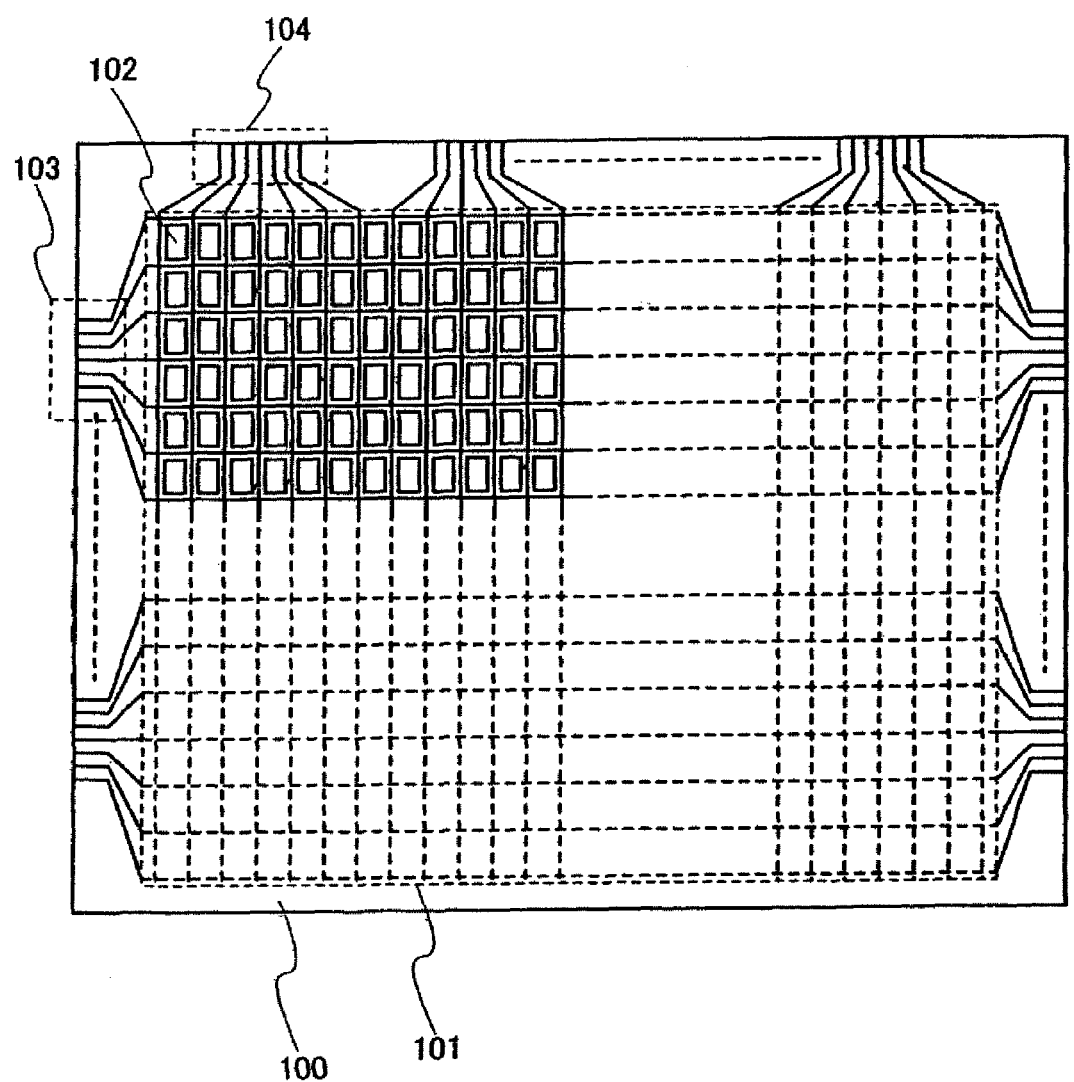
FIG. 1 is a top view showing a structure of a liquid crystal display device.

Embodiment mode of the present invention will be explained in detail with reference to the drawings. Note that the same reference numerals denote the same parts among each drawing, and the explanation will not be repeated in the following explanations. In addition, it is to be understood that various changes and modifications will be apparent to those skilled in the art, unless such changes and modifications depart from content and the scope of the invention. Therefore, the invention is not interpreted with limiting to the description in this embodiment mode.

FIG. 1 shows a top view of a structure of a liquid crystal display device according to a certain aspect of the present invention. A pixel portion 101 in which pixels 102 are arranged in a matrix, a scanning line input terminal 103, and a signal line input terminal 104 are formed on a substrate 100 having an insulating surface. The number of pixels may be provided according to various standards. The number of pixels of XGA may be 1024×768×3 (RGB), that of UXGA may be 1600×1200×3 (RGB), and that of a full-speck high vision to correspond thereto may be 1920×1080×3 (RGB).

The pixels 102 are arranged in matrix by intersecting a scanning line extended from the scanning line input terminal 103 in a driver circuit with a signal line extended from the signal line input terminal 104. The extended scanning line is electrically connected to the gate electrode of the thin film transistor provided in the pixels 102 to transmit a signal thereto. The extended signal line is electrically connected to the source electrode or the drain electrode to transmit a signal thereto. Each of the pixels 102 is provided with a switching element and a pixel electrode connected thereto. A typical example of the switching element is a TFT. A gate electrode side of a TFT is connected to the scanning line, and a source or drain side thereof is connected to the signal line; therefore, each pixel can be controlled independently by a signal inputted from outside. A switching element, a TFT, as a typical example, can be provided in the driver circuit. The TFT in the driver circuit may have the same structure as TFTs in the pixels 102; therefore, the TFTs in the driver circuit and in the pixels 102 can be fabricated simultaneously.

A TFT comprises a semiconductor layer, a gate insulating layer, and a gate electrode as main components. Wirings connected with source and drain regions formed in the semiconductor layer are included too. A top gate type in which a semiconductor layer, a gate insulating layer, and a gate electrode are arranged from the substrate side, a bottom gate type in which a gate electrode, a gate insulating layer, and a semiconductor layer are arranged from the substrate side, or the like is known as a structure of a TFT. However, any one of structures may be applied to the invention.

An amorphous semiconductor (hereinafter also refereed to as an "AS") manufactured by using a semiconductor material gas typified by silane or germane with a vapor phase growth method or a sputtering method; a polycrystalline semiconductor that is formed by crystallizing the amorphous semiconductor by utilizing light energy or thermal energy; a semi-amorphous (also referred to as microcrystallite or microcrystalline, and hereinafter also referred to as an "SAS") semiconductor; or the like can be used for a material which forms a semiconductor layer.

An SAS is a semiconductor with an intermediate structure between an amorphous and a crystal structure (including a single crystal and a polycrystal). This is a semiconductor having a third condition that is stable as a case of a free energy, and a crystalline region having a short distance order and lattice distortion is included therein. A crystalline region of from 0.5 nm to 20 nm can be observed at least in a part of region in the film. When silicon is contained as the main component, Raman spectrum is shifted to a lower frequency side less than 520 cm$^{-1}$. Diffraction peak of (111) or (220) to be caused from a crystal lattice of silicon is observed in X-ray diffraction. At least 1 atomic % or more of hydrogen or halogen is contained as a neutralizer of a dangling bond. An SAS is formed by carrying out grow discharge decomposition (plasma CVD) on a silicide gas. In addition to $SiH_4$, $Si_2H_6$, $SiH_2Cl_2$, $SiHCl_3$, $SiCl_4$, $SiF_4$, or the like can be used for the silicide gas. In addition, $GeF_4$ may be mixed. This silicide gas may be diluted with $H_2$ or $H_2$ and one or more of the rare gas element of He, Ar, Kr, and NC. A dilution ratio ranges from 2 times to 1000 times. A pressure ranges approximately from 0.1 Pa to 133 Pa, and a power frequency ranges from 1 MHz to 120 MHz, preferably from 13 MHz to 60 MHz. A substrate heating temperature may be 300° C. or less. It is desirable that an atmospheric constituent impurity such as oxygen; nitrogen, or carbon is 1×10$^{20}$ atoms/cm$^3$ or less as an impurity element in the film, specifically an oxygen concentration is 5×10$^{19}$ atoms/cm$^3$ or less, preferably 1×10$^{19}$ atoms/cm$^3$ or less.

As a conductive material for forming the wiring by a droplet discharge method, a composition containing a particle of a metal such as Ag (silver), Au (gold), Cu (copper), W (tungsten), Al (aluminum), a particle of Cu coated with Ag, or the like can be used. Further, a light transmitting indium tin oxide (ITO) or indium tin oxide containing silicon oxide (ITSO) may be combined. In particular, since the gate wiring preferably has low resistance, a material in which any one of gold, silver, or copper dissolved or dispersed in a solvent is preferably used, and more preferably, silver or copper with low resistance is used in consideration of a specific resistance value.

Silver is expensive as a conductive material for forming a wiring. Therefore, if a line with a width of several micrometers can be made by using a droplet discharge system in the future, required width may be achieved by combining a plating technology such as copper plating. In the case of carrying out plating, a method in which plating solution is flowed on a large substrate may be applied instead of a method in which a large substrate is dipped in a plating bath like a pool.

In order to improve adhesion between a conductive material for forming a wiring and a substrate, an organic interlayer insulating film, an inorganic interlayer insulating film, or a conductive film, an adhesion improving layer may be formed of a metal material of Ti (titanium), W (tungsten), Cr (chrome), Al (aluminum), Ta (tantalum), Ni (nickel), Zr (zirconium), Hf (hafnium), V (vanadium), Ir (iridium), Nb (niobium), Pd (palladium), Pt platinum), Mo (molybdenum), Co (cobalt), or Rh (rhodium) by sputtering or vapor deposition at 0.01 nm to 10 nm thick. It is preferable to thus perform pretreatment on a surface to be provided with a pattern over the substrate. A photocatalyst layer of TiOx may be formed instead of the metal material. Such an adhesion improving layer may not only be formed under the conductive material layer but also be formed on the conductive material layer to improve adhesion between the conductive material layer and the organic interlayer insulating film, the inorganic interlayer insulating film, or the conductive film which is to be formed thereof.

Figure 2:
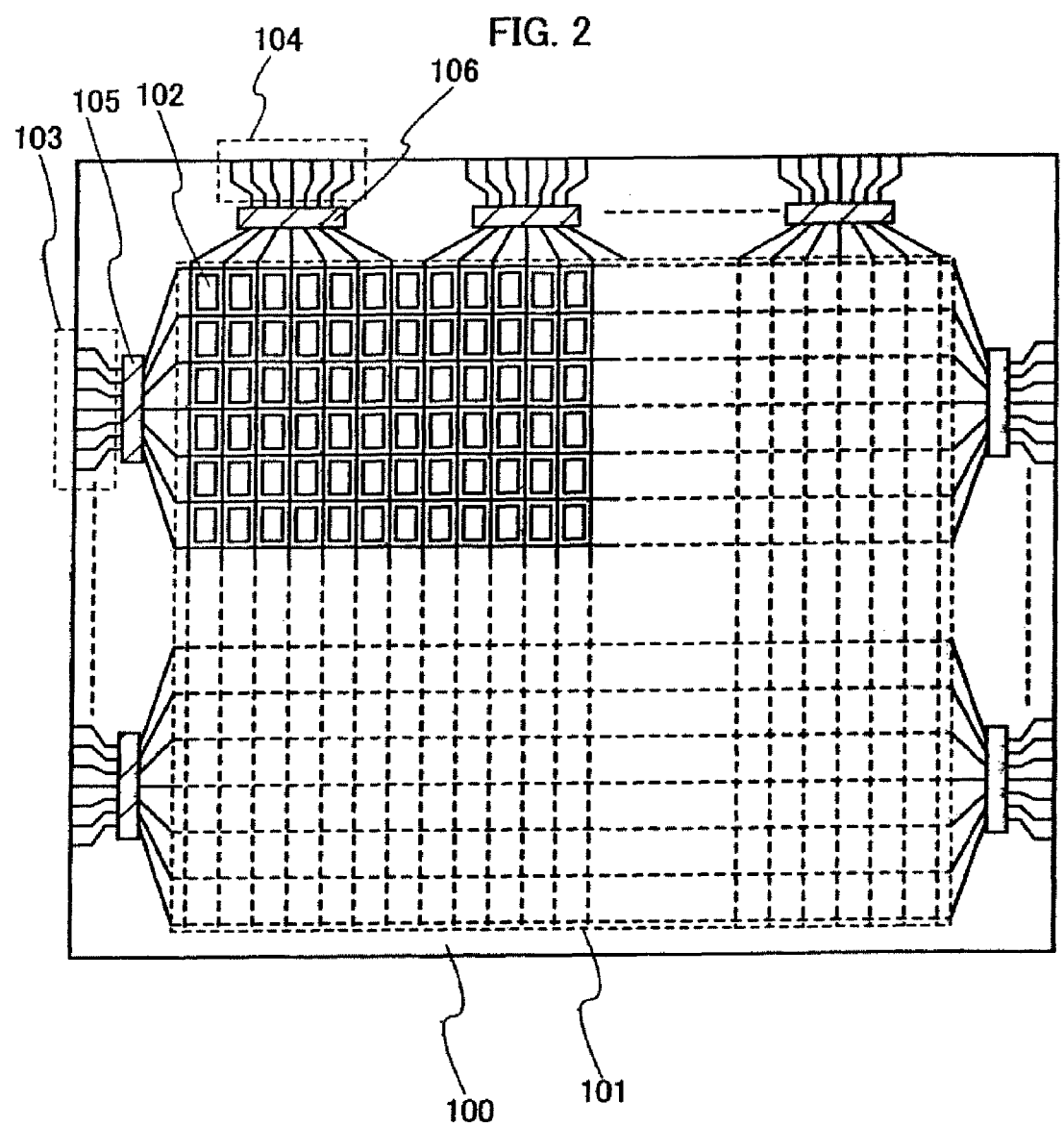
FIG. 2 is a top view showing a structure of a liquid crystal display device.

FIG. 1 shows a structure of a liquid crystal display device in which a signal inputted into a scan line and a signal line is controlled by an external driver circuit. Furthermore, a driver ICs 105 and 106 may be mounted on a substrate 100 by COG (Chip on Glass) as shown in FIG. 2. The driver ICs may be formed on a single crystal semiconductor substrate or may be formed from a circuit with a TFT on a glass substrate.

Figure 3:
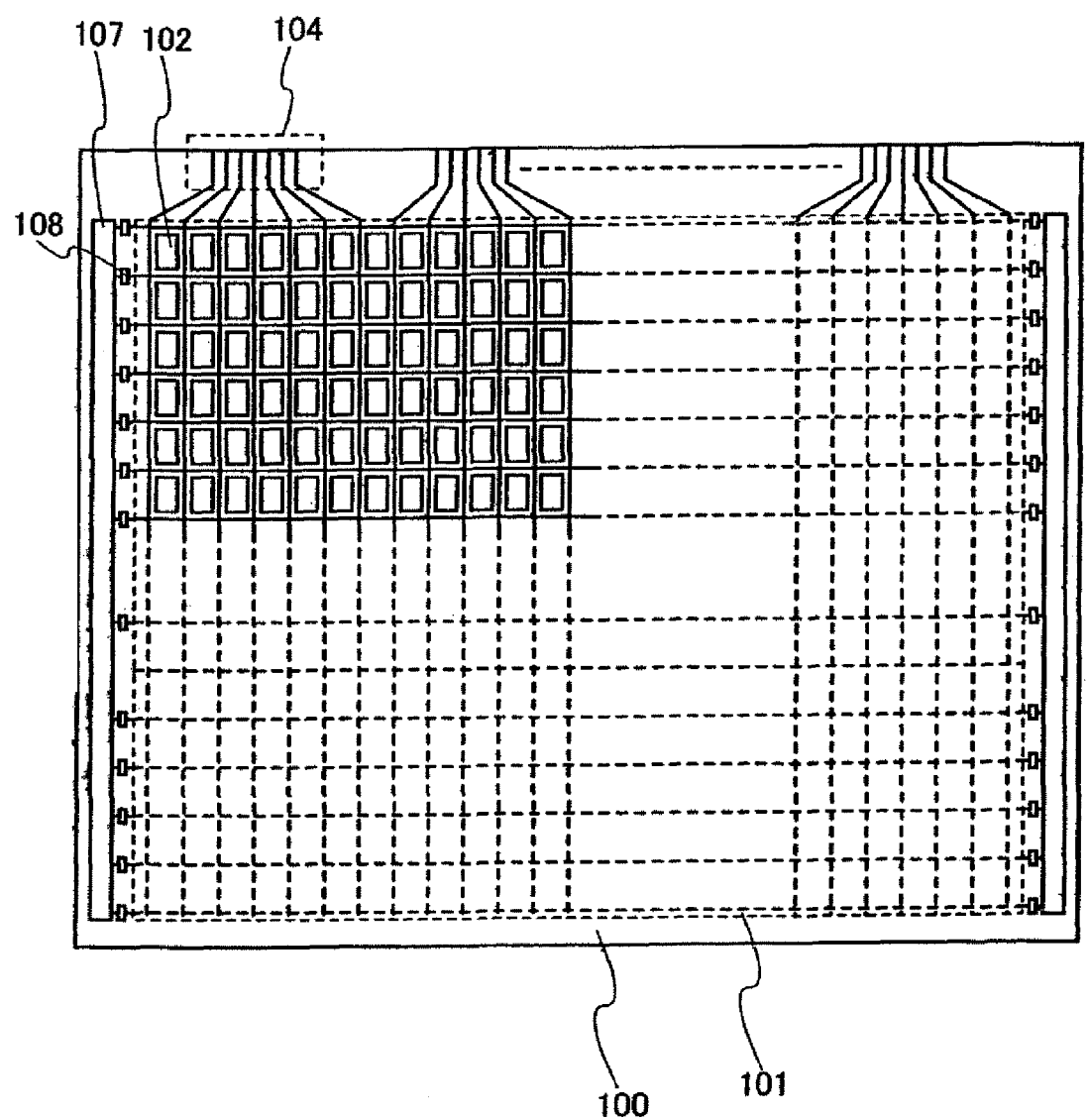
FIG. 3 is a top view showing a structure of a liquid crystal display device.

When a TFT provided on a pixel is formed from an SAS, a scan line driver circuit 107 can be integrally formed on the substrate 100, as shown in FIG. 3. Reference numeral 108 denotes a protection diode.

Figure 30:
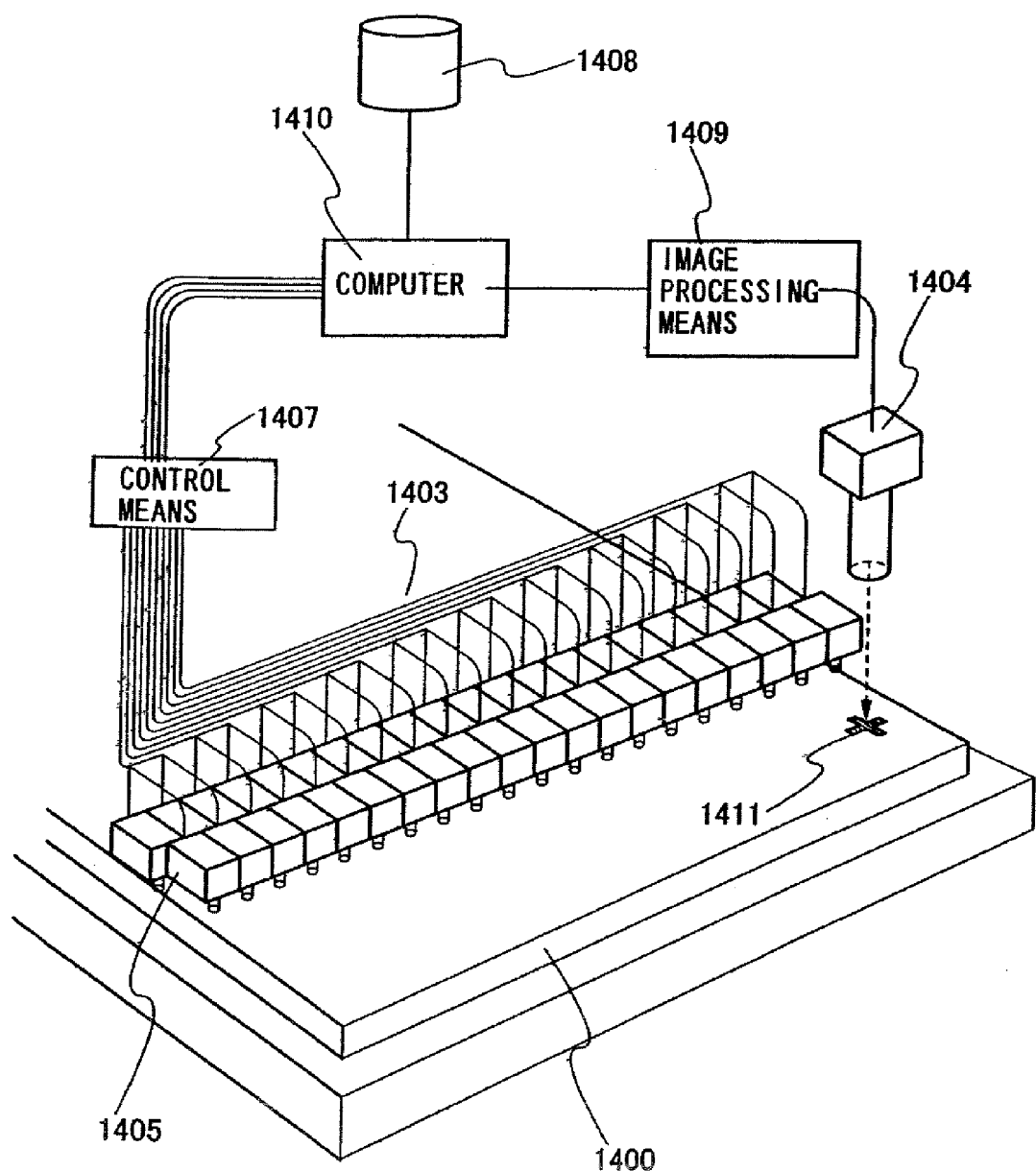
FIG. 30 is a drawing explaining a structure of a droplet discharge system.

FIG. 30 shows one mode of a droplet discharge device used for forming patterns. Each head 1405 of a droplet discharge means 1403 is individually connected to a control means 1407. The control means 1407 controls droplet discharge from the head 1405 based on the program inputted into a computer 1410. When an interlayer insulating film is formed by widely discharging, plural narrow lines are overlapped using the same material in order to improve the throughput. A timing of discharging a droplet may be decided based on a marker 1411 formed on a substrate 1400 for example. In addition, a reference point may be fixed with an edge of the substrate 1400 as a reference. The reference point is detected by an imaging means 1404 such as a CCD, and the computer 1410 recognizes a digital signal converted by an image processing means 1409 to generate a control signal. Of course, information of a pattern to be formed on the substrate 1400 is placed in a recording medium 1408. Based on this information, the control signal can be transmitted to the control means 1407 and each head 1405 of the droplet discharge means 1403 can be controlled individually.

Further, in the case of using a large substrate, the droplet discharge means 1403 may have a size equivalent to the maximum width of a liquid crystal display device. If the size of the droplet discharge means 1403 is equivalent to the maximum width of a liquid crystal display device to be manufactured, the liquid crystal display device can be manufactured efficiently.

Next, details about a pixel 102 will be described according to the manufacturing steps using a droplet discharge method.

Embodiment Mode 1

In this embodiment mode, a manufacturing method of a channel protective type thin film transistor will be described.

FIGS. 4A to 6E show a process of forming a gate electrode and a gate wiring connected to the gate electrode by a droplet discharge method.

In addition to a non-alkaline glass substrate such as barium borosilicate glass, alumino borosilicate glass, or aluminosilicate glass manufactured with a fusion method or a floating method, and a ceramic substrate, a plastic substrate having the heat resistance that can withstand processing temperature or the like can be used for the substrate 100. In addition, a semiconductor substrate such as single crystal silicon, a substrate in which a surface of a metal substrate such as stainless is provided with an insulating layer may be applied too.

An adhesion improving layer 201 formed of a metal material such as Ti (titanium), W (tungsten), Cr (chrome), Al (aluminum), Ta (tantalum), Ni (nickel), Zr (zirconium), Hf (hafnium), V (vanadium), Ir (iridium), Nb (niobium), Pd (palladium), Pt (platinum), Mo (molybdenum), Co (cobalt), or Rh (rhodium), or an oxide thereof ($TiO_x$ etc.) is preferably formed on the substrate 100 by a method such as sputtering or vapor deposition FIG. 4A). The adhesion improving layer 201 may be formed to have a film thickness of from 0.01 nm to 10 nm; however, it is not necessary to have a layer structure since it may be formed extremely thin. Accordingly, it is preferable to perform pretreatment over a surface of the gate electrode etc. to be provided with a pattern. When adequate adhesion is obtained, the gate electrode may be directly formed on the substrate 100 by a droplet discharge method without forming the adhesion improving layer 201.

The adhesion improving layer 201 may be appropriately used in order to improve adhesion of all the layers formed as follows as well as improving the adhesion between the substrate 100 and the gate wiring 202.

A gate wiring 202 and a gate electrode 203 are formed on the adhesion improving layer 201 by discharging a composition containing a conductive substance with a droplet discharge method (FIG. 4B). The composition containing a metal such as silver, gold, copper, tungsten, or aluminum as the main component can be used as the conductive substance which forms these layers. In addition, light transmitting indium tin oxide (ITO) and indium tin oxide containing silicon oxide (ITSO) may be combined. In particular, the gate wiring is preferable to be low resistance. Therefore, a material any one of gold, silver, or copper dissolved or dispersed in a solvent is preferably used, and more preferably, silver or copper with low resistance is used in consideration of a specific resistance value. However, in the case of using silver or copper, a barrier film may be additionally provided for an impurity measure. A solvent corresponds to ester such as butyl acetate, alcohols such as isopropyl alcohol, an organic solvent such as acetone, or the like. Surface tension and viscosity are appropriately adjusted by adjusting density of a solvent and adding a surfactant or the like.

The diameter of a nozzle used in a droplet discharge method is set to be from 0.02 μm to 100 μm (preferably, 30 μm or less), and a discharging amount of a composition discharged from the nozzle is preferably set to be from 0.001 pl to 100 pl (preferably, 10 pl or less). There are two types of an on-demand type and a continuous type for a droplet discharge method, both of which may be used. Furthermore, there is a piezoelectric system using properties transformed by applying voltage pressure of a piezoelectric material and a heating system that boils a composition by a heater provided in a nozzle and discharges the composition for a nozzle to be used in a droplet discharge method, both of which may be used. A distance between a subject and a discharge opening of a nozzle is preferable to be made as close as possible to drop a droplet at a desired place, which is preferably set to be from 0.1 mm to 3 mm (preferably, 1 mm or less). While keeping the relative distance, one of the nozzle and the subject moves and a desired pattern is drawn. In addition, plasma treatment may be carried out on a surface of the subject before discharging a composition. This is to take advantage of a surface of the subject becoming hydrophilic and lyophobic when plasma treatment is carried out. For example, it becomes hydrophilic to deionized water and it becomes lyophobic to a paste dissolved with alcohol.

A step of discharging a composition may be carried out under low pressure so that a solvent of the composition can be volatilized while the composition is discharged and hit on a subject and later steps of drying and baking can be skipped or shorten. After discharging a composition, either or both steps of drying and baking is carried out by irradiation of laser light, rapid thermal annealing, heating furnace, or the like under the atmospheric pressure or the low pressure. Both the steps of drying and baking are steps of heat treatment. For example, drying is carried out at 100° C. for 3 minutes and baking is carried out at temperatures from 200° C. to 350° C. for from 15 minutes to 120 minutes. Thus, the object, temperature and time are different. In order to carry out the steps of drying and baking well, a substrate may be heated, of which temperatures are set to be from 100° C. to 800° C. (preferably, temperatures from 200° C. to 350° C.), though depending on a material of a substrate or the like. Through this step, a solvent in a composition is volatilized or dispersant is removed chemically, and a resin around cures and shrink, thereby accelerating fusion and welding. It is carried out under the oxygen atmosphere, the nitrogen atmosphere, or the atmosphere. However, this step is preferable to be carried out under an oxygen atmosphere in which a solvent decomposing or dispersing a metal element is easily removed.

A continuous-wave or pulsed gas laser or solid state laser may be used for irradiation with laser light. There is an excimer laser, an Ar lazer, or the like as the gas laser, and there is a laser using a crystal such as YAG or $YVO_4$ doped with Cr, Nd, or the like as the solid state laser. It is preferable to use a continuous-wave laser in terms of the laser light absorptance. In addition, a so-called hybrid method of laser irradiation combining a continuous oscillation and a pulsed oscillation may be also used. However, heat treatment by irradiation of laser light may be carried out rapidly from some microseconds to some ten seconds depending on the heat resistance of a substrate. Rapid Thermal Annealing (RTA) is carried out by applying heat rapidly from some microseconds to some minutes by rapidly raising temperature with the use of an infrared lamp that emits light from ultraviolet light to infrared light, a halogen lamp, or the like under the atmosphere of inert gas. This treatment is carried out rapidly; therefore, substantially, only a thin film on an uppermost surface can be heated, and thus, there is advantage that the lower layer is not affected.

After forming the gate wiring 202, the gate electrode 203, and the adhesion improving layer 201, it is desirable to carry out one of the following two steps as treatment of the adhesion improving layer 201 of which surface is exposed.

A first method is a step of forming an insulating layer 205 by insulating the adhesion improving layer 201 not overlapping with the gate wiring 202 and the gate electrode 203, (see FIG. 4C). In other words, the adhesion improving layer 201 not overlapping with the gate wiring 202 and the gate electrode 203 are oxidized to be insulated. In the case of insulating the adhesion improving layer 201 by oxidizing in this manner, the adhesion improving layer 201 is preferably formed to have a film thickness of from 0.01 nm to 10 nm, so that it can be easily oxidized. Note that either an exposing method to the oxygen atmosphere or a method for carrying out heat treatment may be used as an oxidizing method.

A second method is a step of etching and removing the adhesion improving layer 201, using the gate wiring 202, the gate electrode 203, and the gate electrode 203 as the masks. In the case of using this step, there is no restriction on a film thickness of the adhesion improving layer 201.

Next, a gate insulating layer is formed on the gate electrode and the gate wiring in a single layer or a laminated structure by using a plasma CVD method or a sputtering method (see FIG. 4D). As a specifically preferable mode, a stack of three layers of an insulating layer 205 comprising silicon nitride, an insulating layer 206 comprising silicon oxide, and an insulating layer 207 comprising silicon nitride is composed as the gate insulating film. Note that a rare gas such as argon may be contained in a reactive gas and mixed into an insulating film to be formed in order to form a dense insulating film with little gate leak current at a low deposition temperature. Deterioration by oxidation can be prevented by forming the insulating layer 205 comprising silicon nitride or silicon nitride oxide and being in contact with the gate wiring 202 and the gate electrode 203.

Next, a semiconductor layer 208 is formed over the gate electrode with the gate insulating layer therebetween. The semiconductor layer 208 is formed from an AS manufactured with a vapor phase growth method or a sputtering method by using a semiconductor material gas typified by silane or germane or from an SAS. A plasma CVD method or a thermal CVD method can be used as a vapor phase growth method.

In the case of using a plasma CVD method, an AS is formed from $SiH_4$ which is a semiconductor material gas or a mixed gas of $SiH_4$ and $H_2$. When $SiH_4$ is diluted with $H_2$ by from 3 times to 1000 times to make a mixed gas or when $Si_2H_6$ is diluted with $GeF_4$ so that a gas flow rate of $Si_2H_6$ to $GeF_4$ is from 20 to 40 to 0.9, an SAS of which Si composition ratio is 80% or more can be obtained. Specifically, the latter case is preferable since the semiconductor layer 208 can have crystallinity from an interface with the base.

Through the above steps, it is possible to continuously form the insulating layer 205 to the semiconductor layer 208 without exposing to the atmosphere. In other words, each interface between laminated layers can be formed without being contaminated by an atmospheric constituent and an airborne contaminated impurity element that is floated in an atmosphere; therefore, variations in properties of a TFT can be reduced.

Next, a channel protective film 209 is formed by selectively discharging a composition on the insulating layer 208 at a position where the gate electrode 203 is formed thereunder. That is, the channel protective film 209 is overlapped with the gate electrode 203 (see FIG. 4E). A resin material such as epoxy resin, acrylic resin, phenol resin, novolac resin, melamine resin, or urethane resin is used for the channel protective film 209. In addition, the channel protective film 209 is formed with a droplet discharge method by using an organic material such as benzocyclobutene, parylene, flare, or light-transmitting polyimide; a compound material made from polymerization such as siloxane-based polymer; a composition material containing water-soluble homopolymer and water-soluble copolymer; or the like. In using any one of materials, surface tension and viscosity are appropriately adjusted by diluting a solvent or adding a surfactant or the like.

Next, an n-type semiconductor film 210 is formed over the semiconductor film 208 and the channel protective film 209 (FIG. 5A). The n-type semiconductor film 210 may be formed from AS or SAS with the use of silane gas and phosphine gas.

Next, a mask 211 is formed over the n-type semiconductor layer 210. A semiconductor layer 213 having the same conductivity as the semiconductor layer 212 is formed by etching the n-type semiconductor layer 210, the semiconductor layer 208, the insulating layer 205, an insulating layer 206 comprising silicon oxide, and the insulating layer 207 formed of silicon nitride with the use of the mask 211 (FIG. 5B and FIG. 5C). Here, etching is performed so that an end of the semiconductor layer 210 coincides with an end of the gate insulating layer, that is to say, the end of the semiconductor layer 210 does not protrude from the end of the gate insulating layer. The etched semiconductor layer is referred to as an island shape semiconductor layer, and the etched gate insulating layer is referred to as an island shape gate insulating layer.

After the mask 211 is removed, a composition is discharged over the gate wiring 202 and on the position where the source wiring 215 is to be formed, which avoids short circuit between the gate wiring and the source wiring, thereby forming an interlayer insulating film 214 (FIG. 5D). The interlayer insulating film 214 is formed of a resin such as epoxy resin, acrylic resin, phenol resin, novolac resin, melamine resin, or and urethane resin. In addition, the interlayer insulating film 214 is formed by a droplet discharge method using an organic material such as benzocyclobutene, parylene, flare, or light-transmitting polyimide; a compound material made from polymerization such as siloxane-based polymer; a composition containing water-soluble homopolymer and water-soluble copolymer; or the like. In using any one of materials, surface tension and viscosity are appropriately adjusted by diluting a solvent or adding a surfactant or the like. The interlayer insulating film enables planarization of the surface.

Next, source and drain wirings 215 and 216 are formed by discharging a composition containing a conductive material using a droplet discharge method (FIG. 5E).

Subsequently, the n-type semiconductor film 210 over the channel protective film 209 is etched using the source and drain wirings 215 and 216 as masks; thus, n-type semiconductor films 217 and 218 forming source and drain regions are formed (FIG. 6A). The wiring resistance can be decreased with the n-type semiconductor films 217 and 218 forming the source and drain regions. In this embodiment mode, the source and drain wirings are used as the masks; alternatively, another mask may be provided separately.

Next, an insulating layer 219 which serves as a passivation film is formed over the entire surface in order to protect a channel region (FIG. 6B). The insulating layer 219 is preferably formed with a silicon nitride film formed by plasma CVD or sputtering. The film is required to be fine thereby preventing contaminants such as organic substances, metals, and moisture suspended in the atmosphere from entering. For this purpose, if a silicon nitride film is formed by RF sputtering using silicon as a target and a mixture of nitrogen and a rare gas element such as argon as a sputtering gas; thus, the fineness can be promoted by impregnating the film with a rare gas element, which is preferable.

Next, an insulating layer 220 is formed over the entire surface of the substrate (FIG. 6C). The insulating layer 220 is formed by providing an opening having a through hole in accordance with a position where a pixel is formed by corresponding to the first electrode 226. This insulating layer 220 can be formed from an inorganic insulating material such as silicon oxide, silicon nitride, silicon oxynitride, aluminum oxide, aluminum nitride, aluminum oxynitride, or the like; acrylic acid, methacrylic acid, and a derivative thereof; a high molecular weight material having heat resistance such as polyimide, aromatic polyamide, or polybenzimidazole; inorganic siloxane including a Si—O—Si bond, among the compound made from silicon, oxygen, and hydrogen, formed by using a siloxane-based material as a start material; or an organic siloxane insulating material in which hydrogen over silicon is substituted by an organic group such as methyl or phenyl. When the insulating layer 220 is formed from a photosensitive material or a non-photosensitive material such as acrylic or polyimide, it is preferable since the edge thereof has a shape in which a curvature radius changes continuously and a thin film in the upper layer is formed without a step discontinuity.

The insulating layer 220 is formed over the entire surface by a droplet discharge method, spin coating, or dip coating. An opening is formed in the predetermined portion of the insulating layer 220 by etching or the like. Here, the insulating layer 219 formed under the insulating layer 220 is simultaneously etched, so as to expose the predetermined portions of the gate wiring 202, the source and drain wirings 215 and 216. Further, it is prefer that when the insulating layer 220 is selectively formed by a droplet discharge method since the insulating layer 220 is not necessarily etched.

As a method for forming an opening in the insulating layer 220, the following steps may be used. First, the entire surface of the substrate is made repellent by being coated with a liquid repellent agent such as a fluorine-based coupling agent such as fluoroalkyl silane; or an organic material containing fluorine such as $CHF_3$ before forming the insulating layer 220. Subsequently, a mask material is applied to the portion where the opening is to be formed, and $O_2$ ashing or the like is performed; thus, the liquid repellent agent applied on the area except the portion provided with the mask is removed. Next, the mask is removed, and the insulating layer 220 is formed over the entire surface of the substrate by spin coating, dip coating, or a droplet discharge method. The insulating layer 220 is not formed on the portion which is made repellent; thus, an opening is formed on the portion. Note that, in applying a liquid repellent agent, if only the opening is coated with the liquid repellent agent by a droplet discharge method, the steps of forming the mask, removing the liquid repellent agent, and removing the mask are not required.

Figure 14A:
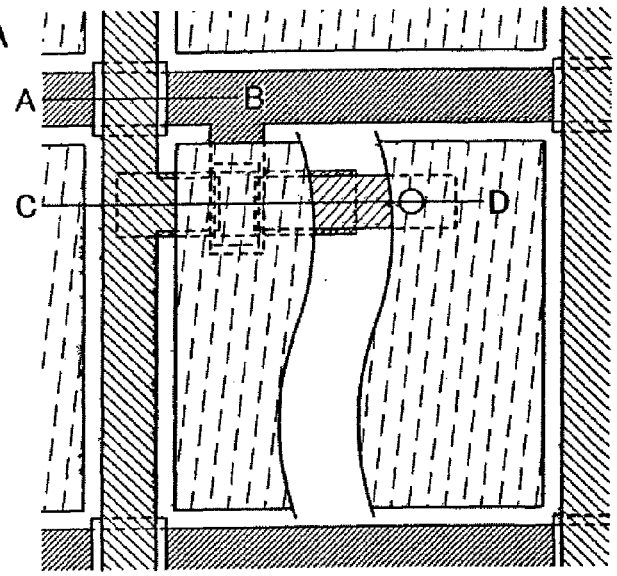
FIGS. 14A to 14C show a top view and cross-sectional views describing a manufacturing method of a liquid crystal display device.
Figure 14B:
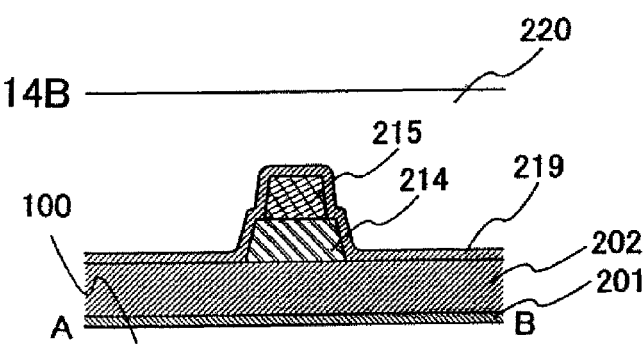
Figure 14C:
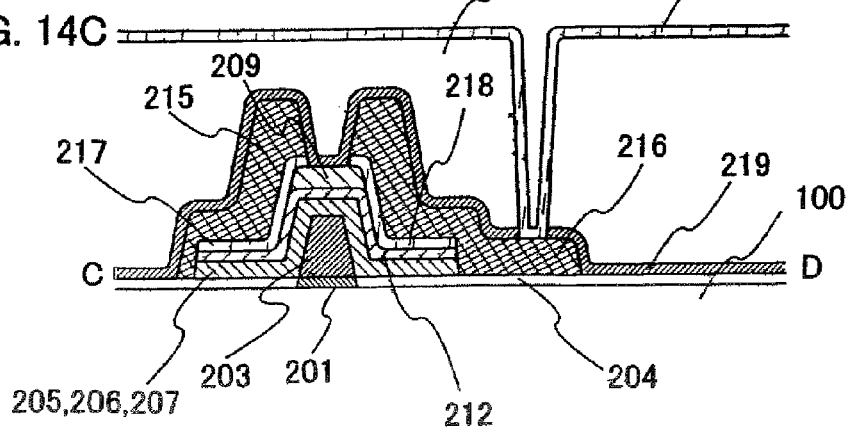

Next, a pixel electrode layer corresponding to a pixel electrode 221 is to be electrically connected to the drain wiring 216 by discharging a composition containing a conductive material (FIG. 6D). The pixel electrode 221 is formed by baking a composition having a particular pattern, containing indium tin oxide (ITO), indium tin oxide containing silicon oxide (ITSO), zinc oxide (ZnO), tin oxide ($SnO_2$), or the like. In the case of a reflective type liquid crystal display device, the composition containing Ag (silver), Au (gold), Cu (copper), W (tungsten), or Al (aluminum) can be used as the main component. As another method, a transparent conductive film or a light reflective conductive film is formed by sputtering; a mask pattern is formed by a droplet discharge method; and a pixel electrode may be formed by combining etching. FIG. 14A shows a plane structure, FIG. 14B shows a A-B, and FIG. 14C shows a longitudinal sectional structure corresponding to C-D; accordingly, the views can been seen concurrently.

Through the above steps, a TFT substrate 200 for a liquid crystal display device in which a bottom gate (inverted staggered) TFT and a pixel electrode are connected over the substrate 100 is completed (FIG. 6D).

Next, an insulating layer 222 which is referred to as an alignment layer is formed by printing or spin coating so as to cover the pixel electrode 221. The insulating layer 222 can be selectively formed as shown by screen printing or off-set printing. Thereafter, rubbing is performed. Subsequently, a sealant 223 is formed on the peripheral area around the pixel formed by a droplet discharge method (FIG. 13).

The counter substrate 229 provided with the insulating layer 224 serving as a alignment layer, and the conductive layer 225 serving as a counter electrode is pasted to the TFT substrate 200 with a spacer (not shown) therebetween. The gap between substrates may be provided with a liquid crystal layer, thereby manufacturing a liquid crystal display device (FIG. 13). A filler may be mixed in the sealant 223. Further, the counter substrate 229 may be provided with a color filter or a light shielding film (black matrix), or the like. Note that as a method for forming a liquid crystal layer, dispensing method (dropping method), or dip coating (pumping up method) by which liquid crystal is injected by capillary phenomenon after the counter substrate 229 is pasted.

As described above, in this embodiment mode, the process can be simplified by skipping a light exposure step using a photomask can be omitted. Also, since some patterns are formed directly on the substrate by droplet discharging method, a liquid crystal display device can be manufactured easily even if one side of the substrate (after the fifth generation) has a length of one meter or more.

Embodiment Mode 2

The structure of a channel protective type has been shown in Embodiment Mode 1. In this embodiment, a channel etch type in which a channel protective film is not formed will be described as another mode.

A gate wiring 202 and a gate electrode 203 are formed by discharging a composition containing a conductive material on a substrate 100. Next, a gate insulating film having a single layer or layered structure is formed by plasma CVD or sputtering. As a particularly preferred mode, a stack having three layers of an insulating layer 205 formed of silicon nitride, an insulating layer 206 formed of silicon oxide, and an insulating film 207 formed of silicon nitride is equivalent to the gate insulating film. Further, up to a semiconductor film 208 serving as an active layer is formed. Thus, steps shown in FIGS. 4A to 4D are similar to Embodiment Mode 1.

Next, an n-type semiconductor film 301 is formed over the semiconductor film 208 (FIG. 7A). The n-type semiconductor film 301 may be formed from AS or SAS with the use of silane gas and phosphine gas.

Through the above steps, it is possible to continuously form the insulating layer 205 to the semiconductor layer 301 without exposing to the atmosphere. In other words, each interface between laminated layers can be formed without being contaminated by an atmospheric constituent and a contaminated impurity element suspending in an atmosphere; therefore, variations in properties of a TFT can be reduced.

Next, a mask 302 is formed by selectively discharging a composition on the semiconductor layer 301 by a droplet discharge method (FIG. 7B). The semiconductor layer 208 and the n-type semiconductor layer 301, and the gate insulating layers 205, 206, and 207 of the gate insulating layer are etched simultaneously with the use of the mask 302; thus, a semiconductor layer 303 and an n-type semiconductor layer 304 are formed (FIG. 7C).

After the mask 302 is removed, a composition is discharged onto the gate wiring 202 and to the position where the source wiring 306 is to be formed, thereby forming an interlayer film 305 (FIG. 7D). The interlayer film 305 is formed of a resin such as epoxy resin, acrylic resin, phenol resin, novolac resin, melamine resin, or and urethane resin. In addition, the interlayer film 305 is formed by a droplet discharge method using an organic material such as benzocyclobutene, parylene, flare, or light-transmitting polyimide; a compound material made from polymerization such as siloxane-based polymer; a composition containing water-soluble homopolymer and water-soluble copolymer; or the like. In using any one of materials, surface tension and viscosity are appropriately adjusted by diluting a solvent or adding a surfactant or the like.

A composition containing a conductive material is discharged onto the semiconductor layer 304; thereby forming source and drain wirings 306 and 307 (FIG. 7E).

Subsequently, semiconductor layers 308 and 309 are formed by etching the n-type semiconductor layer 304 with the use of the source and drain wirings 306 and 307 as masks. On this occasion, the semiconductor layer 303 is also etched somewhat, and a semiconductor layer 310 is formed (FIG. 8A). The subsequent steps are the same as the steps in Embodiment Mode 1 (FIGS. 8B to 8D)

Figure 15A:
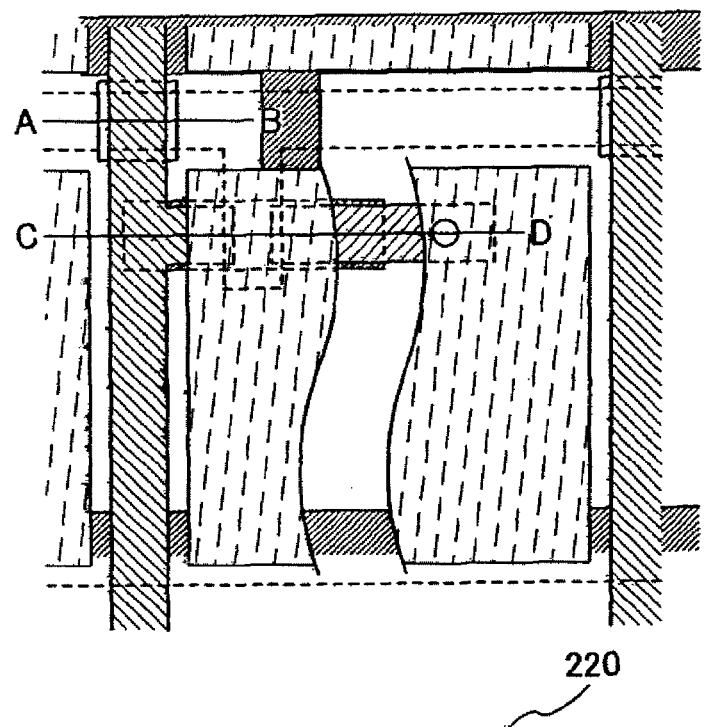
FIGS. 15A to 15C show a top view and cross-sectional views explaining a manufacturing method of a liquid crystal display device.
Figure 15B:
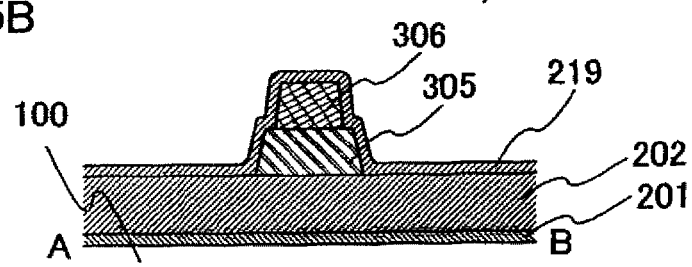
Figure 15C:
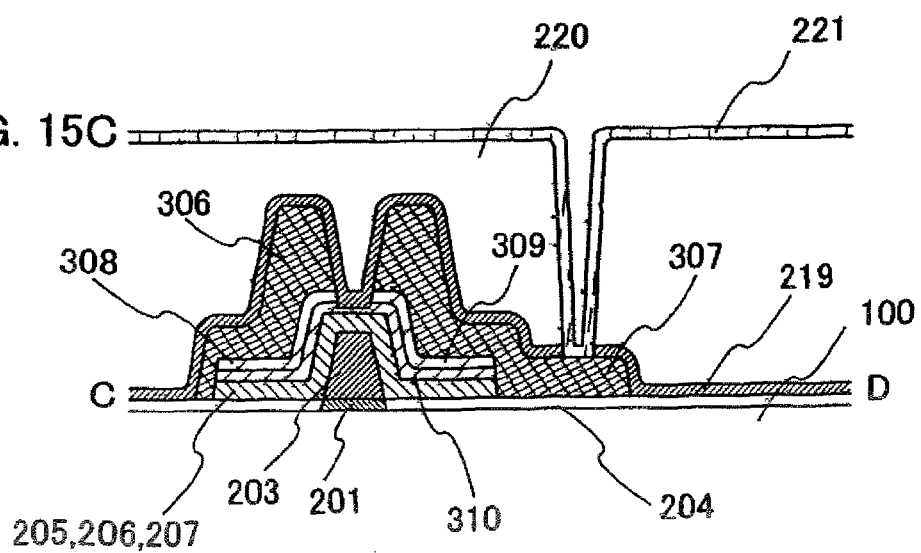

Through the above steps, a TFT substrate 300 for a liquid crystal display device in which a bottom gate (inverted staggered) channel etch TFT and a pixel electrode 221 are connected over the substrate 100 is completed (FIG. 8D). FIG. 15A shows a plane structure, FIG. 15B shows a A-B, and FIG. 15C shows a longitudinal sectional structure corresponding to C-D; accordingly, the views can been seen concurrently.

Embodiment Mode 3

In Embodiment Modes 1 and 2, modes in each of which the entire surface of the substrate is covered with the protective layer 219 and the insulating film 220. In this embodiment mode, only a TFT and a wiring are covered with a protective layer 219 and an insulating film 701.

After a semiconductor film is formed over a substrate 100, an insulating film is formed in order to protect a channel region. Thus, the steps shown in FIGS. 6A and 6B are similar to Embodiment Mode 1. In the case of forming a semiconductor film of a channel etch type, Embodiment Mode 2 may be used.

Next, an insulating layer 701 is selectively formed only over a semiconductor layer of the substrate, the gate wiring 202, and source and drain wirings 215 and 216 by a droplet discharge method (FIG. 9A). The insulating layer 701 is not formed over the portion which is to be electrically connected to a pixel electrode 221 to be formed later over the drain wiring 216, and the portion which is to be electrically connected to an external wiring (not shown) over the gate wiring and the source wiring 215. This insulating layer 701 can be formed from an inorganic insulating material such as silicon oxide, silicon nitride, silicon oxynitride, aluminum oxide, aluminum nitride, aluminum oxynitride, or the like; acrylic acid, methacrylic acid, and a derivative thereof; a high molecular weight material having heat resistance such as polyimide, aromatic polyamide, or polybenzimidazole; inorganic siloxane including a Si—O—Si bond, among the compound made from silicon, oxygen, and hydrogen, formed by using a siloxane-based material as a start material; or an organic siloxane insulating material in which hydrogen over silicon is substituted by an organic group such as methyl or phenyl. When the insulating layer is formed from a photosensitive material or a non-photosensitive material such as acrylic or polyimide, it is preferable since the edge thereof has a shape in which a curvature radius changes continuously and a thin film in the upper layer is formed without a step discontinuity.

Then, the protective layer 219 is etched by dry etching or wet etching using the insulating layer 710 as a mask, thereby forming an opening. At this point, predetermined portions of the gate wiring 202 under the protective layer 219 and predetermined portions of the source and the drain wirings 215 and 216 are exposed.

Next, a pixel electrode layer corresponding to a pixel electrode 702 is to be electrically connected to the drain wiring 216 by selectively discharging a composition containing a conductive material (FIG. 9C). The pixel electrode 702 is formed by baking a composition having a particular pattern, containing indium tin oxide (ITO), indium tin oxide containing silicon oxide (ITSO), zinc oxide (ZnO), tin oxide ($SnO_2$), or the like. In the case of a reflective liquid crystal display device, the composition containing particles of metal, such as Ag (silver), Au (gold), Cu (copper), W (tungsten), or Al (aluminum) can be used as the main component. As another method, a transparent conductive film or a light reflective conductive film is formed by sputtering; a mask pattern is formed by a droplet discharge method; and a pixel electrode may be formed by combining etching.

Figure 16A:
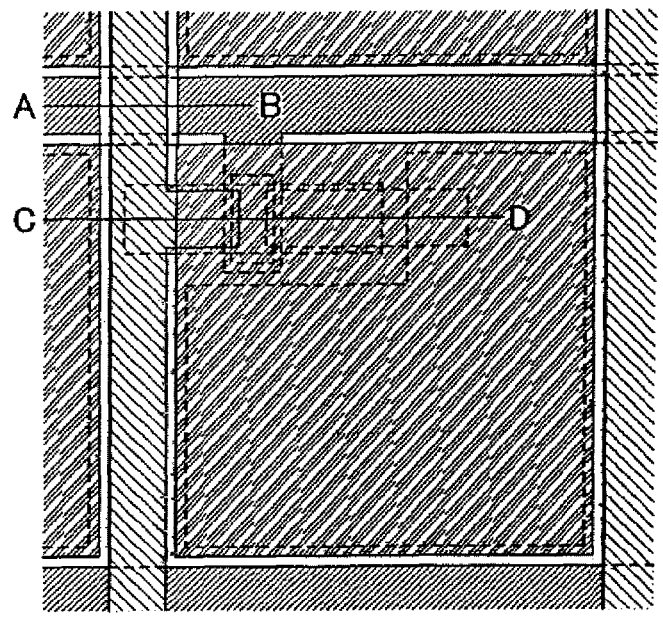
FIGS. 16A to 16C show a top view and cross-sectional views explaining a manufacturing method of a liquid crystal display device.
Figure 16B:
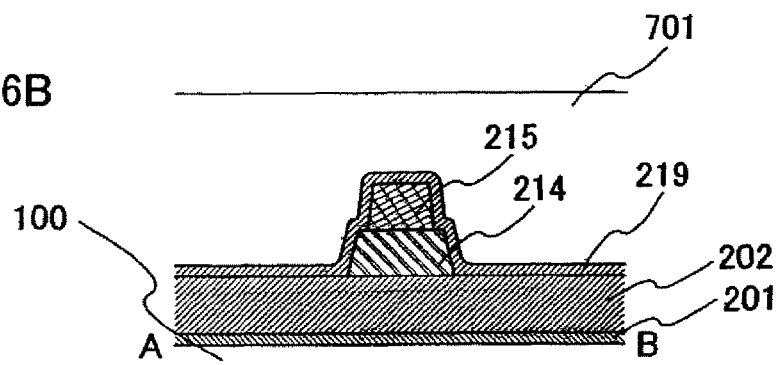
Figure 16C:
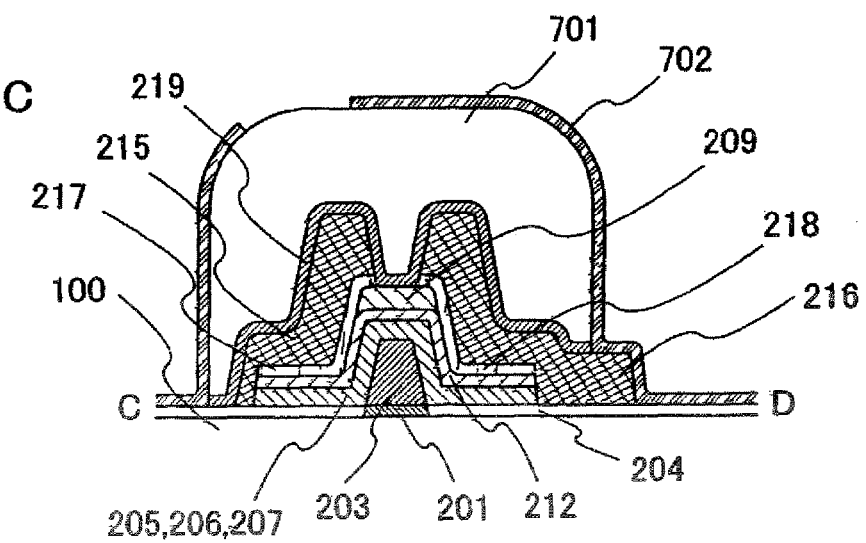

Through the above steps, a TFT substrate 700 for a liquid crystal display device in which a bottom gate (inverted staggered) TFT and a pixel electrode 221 are connected over the substrate 100 is completed (FIG. 9C). FIG. 16A shows a plane structure, FIG. 16B shows a A-B, and FIG. 16C shows a longitudinal sectional structure corresponding to C-D; accordingly, the views can been seen concurrently.

Embodiment Mode 4

In Embodiment Mode 4, a mode in which a pixel electrode 501 is formed under a drain wiring 516 will be described. As an example of embodiment modes, a channel protective type in which an insulating layer for protecting a channel region (hereinafter referred to as a channel protective layer) is provided will be described here. However, a channel etch type in which a channel region is not provided with a channel protective layer as in Embodiment Mode 3 can also be formed.

FIGS. 10A to 10E, 11A to 11E, and 12A to 12E show steps of forming a gate electrode and a gate wiring connected to the gate electrode over the substrate 100 by a droplet discharge method.

An adhesion improving layer 201 is formed over the substrate 100 by sputtering, vapor deposition, or the like (FIG. 1A). Note that, if sufficient adhesion can be obtained, the gate electrode may be directly formed on the substrate without forming the adhesion improving layer.

A pixel electrode layer corresponding to the pixel electrode 501 is formed by selectively discharging a composition containing a conductive material onto an adhesion improving layer 201 (FIG. 10B). The pixel electrode 501 may be formed by baking a composition having a particular pattern, containing indium tin oxide (ITO), indium tin oxide containing silicon oxide (ITSO), zinc oxide (ZnO), tin oxide ($SnO_2$), or the like. In the case of a reflective liquid crystal display device, the composition containing particles of metal, such as Ag (silver), Au (gold), Cu (copper), W (tungsten), or Al (aluminum) can be used as the main component. As another method, a transparent conductive film or a light reflective conductive film is formed by sputtering; a mask pattern is formed by a droplet discharge method; and a pixel electrode may be formed by combining etching. Further, the pixel electrode can be formed under the adhesion improving layer 201 before forming the adhesion improving layer 201.

A gate wiring 502 and a gate electrode 503 are formed on the adhesion improving layer 201 by discharging a composition containing a conductive material with a droplet discharge method (FIG. 10C). The composition containing particles of metal such as Ag (silver), Au (gold), Cu (copper), W (tungsten), or Al (aluminum) as the main component can be used as the conductive substance which forms these layers. In addition, light transmitting indium tin oxide (ITO) and indium tin oxide containing silicon oxide (ITSO) may be combined. In particular, the gate wiring is preferable to be low resistance. Therefore, a material any one of gold, silver, or copper dissolved or dispersed in a solvent is preferably used, and more preferably silver or copper with low resistance is used in consideration of a specific resistance value. However, in the case of using silver or copper, a barrier film may be additionally provided for a measure against impurities. A solvent corresponds to ester such as butyl acetate, alcohols such as isopropyl alcohol, an organic solvent such as acetone, or the like. Surface tension and viscosity are appropriately adjusted by adjusting density of a solvent and adding a surfactant or the like.

After forming the gate wiring 502 and the gate electrode 503, it is desirable to carry out one of the following two steps as treatment of the adhesion improving layer 201 of which surface is exposed.

A first method is a step of forming an insulating layer 504 by insulating a portion of the adhesion improving layer 201 not overlapping with the gate wiring 502, the gate electrode 503, and the pixel electrode 501 (see FIG. 10D). Here, the adhesion improving layer 201 not overlapping with the gate wiring 502 and the gate electrode 503 are oxidized in order to be insulated. In the case of insulating the adhesion improving layer 201 by oxidizing in this manner, the adhesion improving layer 201 is preferably formed to have a film thickness of from 0.01 nm to 10 nm, so that it can be easily oxidized. Note that either an exposing method to the oxygen atmosphere or a method for carrying out heat treatment may be used as an oxidizing method.

A second method is a step of etching and removing the adhesion improving layer 201, using the gate wiring 502, the gate electrode 503, and the pixel electrode 501 as the masks. In the case of using this step, there is no restriction on a film thickness of the adhesion improving layer 201.

Next, a gate insulating layer is formed in a single layer or a laminated structure by using a plasma CVD method or a sputtering method (see FIG. 10E). As a specifically preferable mode, a stack of three layers of an insulating layer 505 made from silicon nitride, an insulating layer 506 made from silicon oxide, and an insulating layer 507 made from silicon nitride is composed as the gate insulating film. Note that a rare gas such as argon may be contained in a reactive gas and mixed into an insulating film to be formed in order to form a dense insulating film with little gate leak current at a low deposition temperature. Deterioration by oxidation can be prevented by forming the insulating layer 505 being in contact with the gate wiring 502 and the gate electrode 503 from silicon nitride or silicon nitride oxide.

Next, a semiconductor layer 508 is formed (FIG. 10E). The semiconductor layer 508 is formed from an AS or SAS manufactured with a vapor phase growth method by using a semiconductor material gas typified by silane or germane, or with a sputtering method by using silicon target. A plasma CVD method or a thermal CVD method can be used as a vapor phase growth method.

In the case of using a plasma CVD method, an AS is formed from $SiH_4$ which is a semiconductor material gas or a mixed as of $SiH_4$ and $H_2$. When $SiH_4$ is diluted with $H_2$ by from 3 times to 1000 times to make a mixed gas or when $Si_2H_6$ is diluted with $GeF_4$ so that a gas flow rate of $Si_2H_6$ to $GeF_4$ is from 20 to 40 to 0.9, an SAS of which Si composition ratio is 80% or more can be obtained. Specifically, the latter case is preferable since the semiconductor layer 508 can have crystallinity from an interface with the base.

Through the above steps, it is possible to continuously form the insulating layer 505 to the semiconductor layer 508 without exposing to the atmosphere. In other words, each interface between laminated layers can be formed without being contaminated by an atmospheric constituent and a contaminated impurity element that is floated in an atmosphere; therefore, variations in properties of a TFT can be reduced.

Next, a channel protective film 509 is formed by selectively discharging a composition at a position that is opposed to the gate electrode 503 and that is on the insulating layer 508 (see FIG. 11A). A resin material such as epoxy resin, acrylic resin, phenol resin, novolac resin, melamine resin, or urethane resin is used for the channel protective film 509. In addition, the channel protective film 509 is formed with a droplet discharge method by using an organic material such as benzocyclobutene, parylene, flare, or light-transmitting polyimide; a compound material made from polymerization such as siloxane-based polymer; a composition material containing water-soluble homopolymer and water-soluble copolymer; or the like. In using any one of materials, surface tension and viscosity are appropriately adjusted by diluting a solvent or adding a surfactant or the like.

Next, an n-type semiconductor film 510 is formed over the semiconductor film 508 (FIG. 11B). The n-type semiconductor film 510 may be formed from AS or SAS with the use of silane gas and phosphine gas.

Next, a mask 511 is formed over the semiconductor layer 510 by a droplet discharge method (FIG. 11C). By etching the n-type semiconductor layer 510, the semiconductor layer 508, the semiconductor layer 505, the insulating layer 506 formed of silicon oxide, the insulating layer 507 formed of silicon nitride with the use of the mask 511, a semiconductor layer 513 having the same conductivity as the semiconductor layer 512 is formed (FIG. 11D).

After the mask 511 is removed, a composition is discharged onto the gate wiring 502 and to the position where the source wiring 515 is to be formed, thereby forming an interlayer insulating film 514 (FIG. 11E). The interlayer insulating film 514 is formed of a resin such as epoxy resin, acrylic resin, phenol resin, novolac resins melamine resin, or and urethane resin. In addition, the interlayer insulating film 514 is formed by a droplet discharge method using an organic material such as benzocyclobutene, parylene, flare, or light-transmitting polyimide; a compound material made from polymerization such as siloxane-based polymer; a composition containing water-soluble homopolymer and water-soluble copolymer; or the like. In using any one of materials, surface tension and viscosity are appropriately adjusted by diluting a solvent or adding a surfactant or the like.

Next, source and drain wirings 515 an 516 are formed by selectively discharging a composition containing a conductive material by a droplet discharge method (FIG. 11A). As a conductive material for forming the wirings, a composition containing particles of a metal such as Ag (silver), Au (gold), Cu (copper), W (tungsten), or Al (aluminum) may be used. Also, transparent indium tin oxide (ITO), indium tin oxide containing silicon oxide (ITSO), organic indium, organic tin, zinc oxide, titan nitride, or the like can be combined as a material.

Figures 12A, 12B, 12C, 12D, 12E:
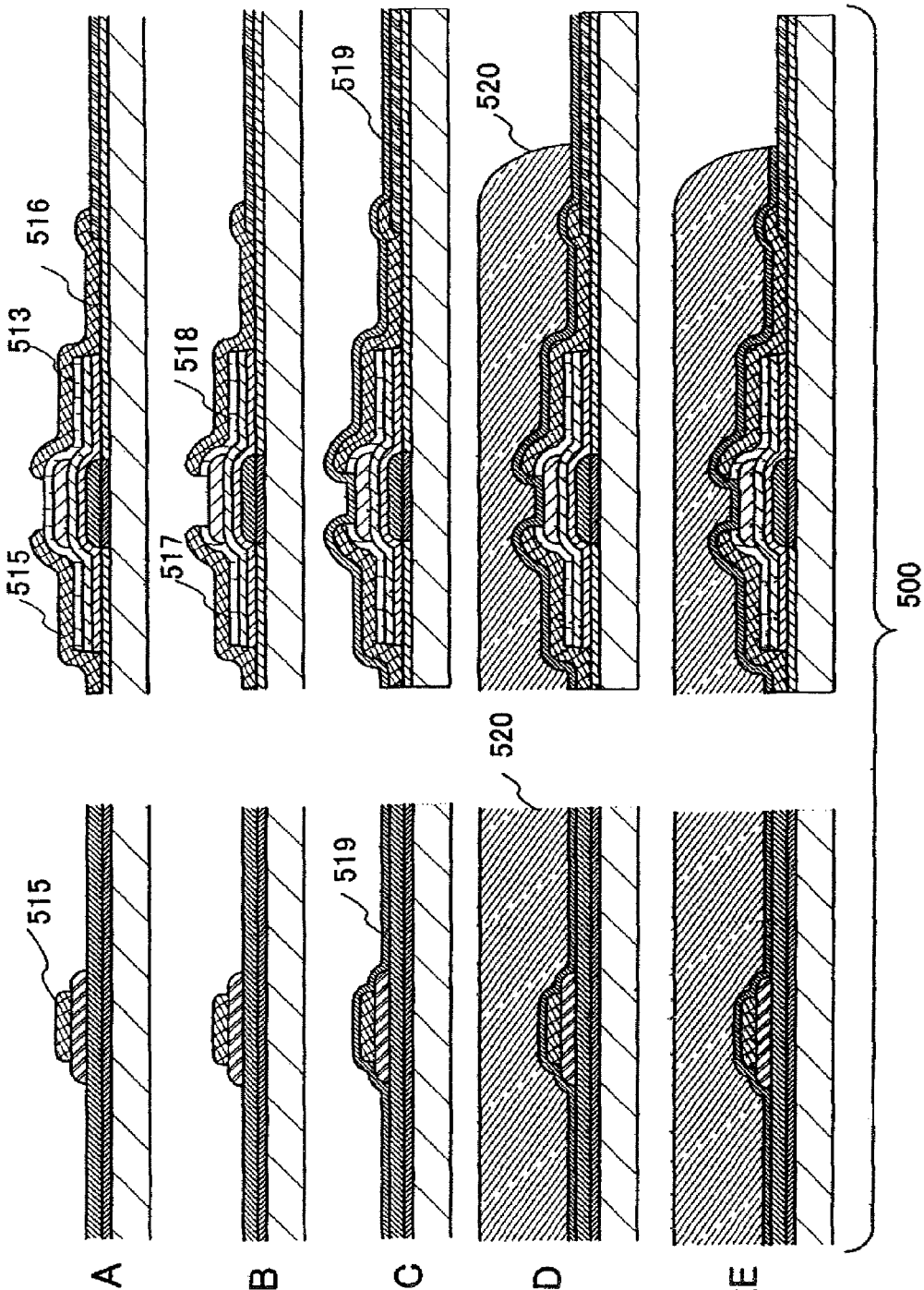
FIGS. 12A to 12E are cross-sectional views explaining a manufacturing method of a liquid crystal display device.

Subsequently, the semiconductor film 513 having one conductivity type over the channel protective film 509 is etched using the source and drain wirings 515 and 516 as masks; thus, n-type semiconductor films 217 and 218 forming source and drain regions are formed (FIG. 12B).

Next, a protective layer 519 which is an insulating layer formed in order to protect a channel region (FIG. 12C). The insulating layer 519 is preferably formed with a silicon nitride film formed by plasma CVD or sputtering. The film is required to be fine thereby preventing contaminants such as organic substances, metals, and moisture suspended in the atmosphere from entering. For this purpose, if a silicon nitride film is formed by RF sputtering using silicon as a target and a mixture of nitrogen and a rare gas element such as argon as a sputtering gas; thus, the fineness can be promoted by impregnating the film with a rare gas element, which is preferable.

Next, an insulating layer 520 is selectively formed only over a semiconductor layer of the substrate, the gate wiring 502, and source and drain wirings 515 and 516 by a droplet discharge method (FIG. 12D). The insulating layer 520 is not formed over the portion which is to be electrically connected to a pixel electrode 521 over the drain wiring 516, and the portion which is to be electrically connected to an external wiring (not shown) over the gate wiring 502 and the source wiring 515. This insulating layer 520 can be formed from an inorganic insulating material such as silicon oxide, silicon nitride, silicon oxynitride, aluminum oxide, aluminum nitride, aluminum oxynitride, or the like; acrylic acid, methacrylic acid, and a derivative thereof a high molecular weight material having heat resistance such as polyimide, aromatic polyamide, or polybenzimidazole; inorganic siloxane including a Si—O—Si bond, among the compound made from silicon, oxygen, and hydrogen, formed by using a siloxane-based material as a start material; or an organic siloxane insulating material in which hydrogen over silicon is substituted by an organic group such as methyl or phenyl.

Then, the insulating layer 519 is etched by dry etching or wet etching using the insulating layer 520 as a mask, thereby forming an opening (FIG. 12E). At this point, predetermined portions of the gate wiring 502, the source and the drain wirings 515 and 516, and the pixel electrode 501 located under the insulating layer 519 are exposed.

Figure 17A:
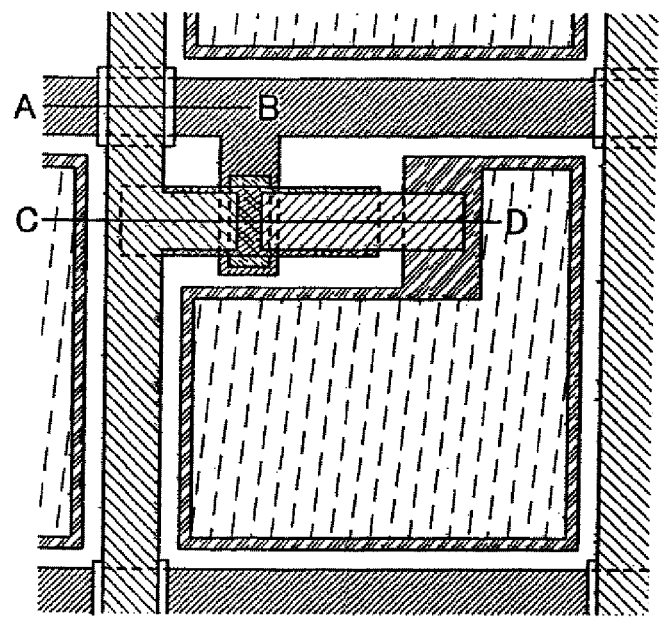
FIGS. 17A to 17C show a top view and cross-sectional views explaining a manufacturing method of a liquid crystal display device.
Figure 17B:
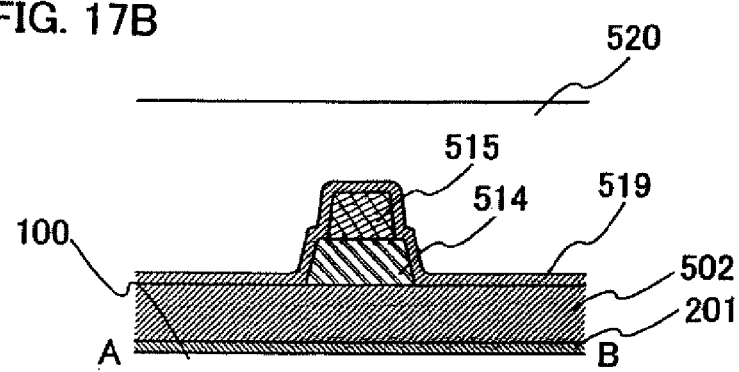
Figure 17C:
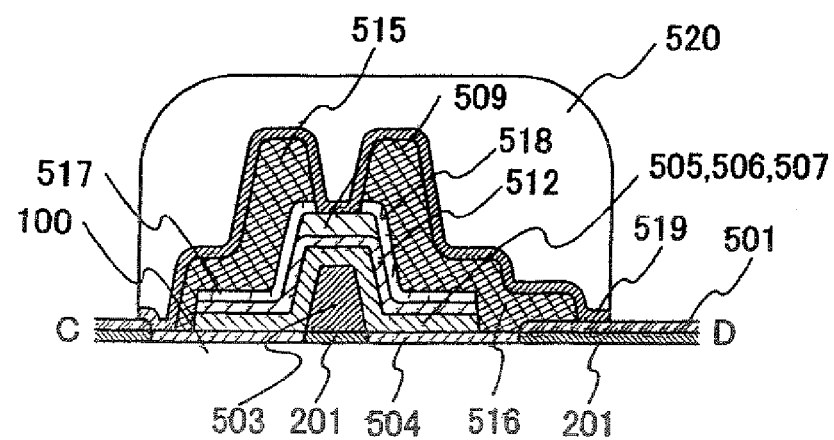

Through the above steps, a TFT substrate 500 for a liquid crystal display device in which a bottom gate (inverted staggered) TFT and a pixel electrode are connected over the substrate 100 is completed (FIG. 12E). FIG. 17A shows a plane structure, FIG. 17B shows a A-B, and FIG. 17C shows a longitudinal sectional structure corresponding to C-D; accordingly, the views can been seen concurrently.

Embodiment 1

In a liquid crystal display device manufactured by Embodiment Mode 1, Embodiment Mode 2, Embodiment Mode 3, or Embodiment Mode 4, as explained in FIG. 3, a scanning line driver circuit can be formed on a substrate 100 by forming a semiconductor layer from an SAS.

Figure 22:
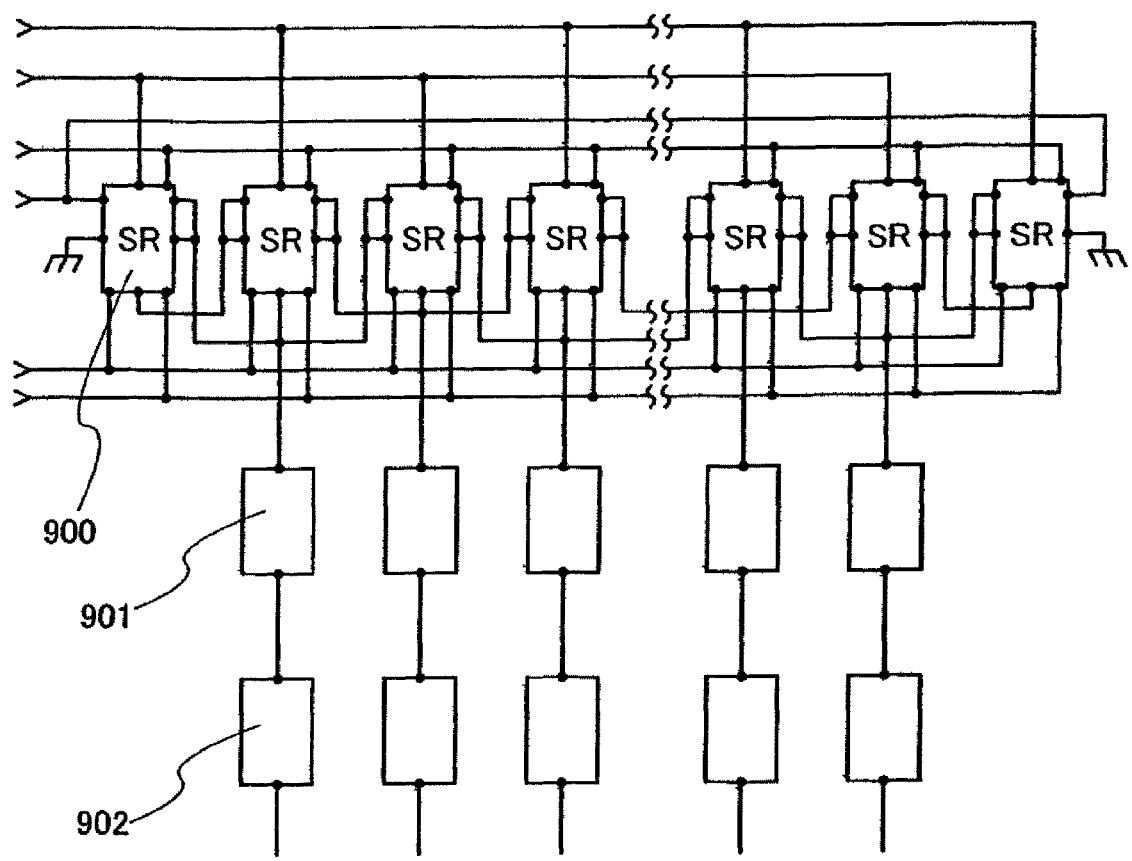
FIG. 22 is a drawing explaining a circuit configuration when a scan line driver circuit of a liquid crystal display device is formed from a TFT.

FIG. 22 shows a block diagram of the scanning line driver circuit composed of n-channel type TFTs using the SAS in which electric field effect mobility of from 1 $cm^2/V \cdot sec$ to 15 $cm^2/V \cdot sec$ is obtained.

A block shown in reference numeral 1500 corresponds to a pulse output circuit outputting a sampling pulse for one step in FIG. 22, and a shift register is composed of n pieces of pulse output circuit. Reference numeral 1501 denotes a buffer circuit, and a pixel 1502 (corresponding to the pixel 102 in FIG. 3) is connected at the ends thereof.

Figure 23:
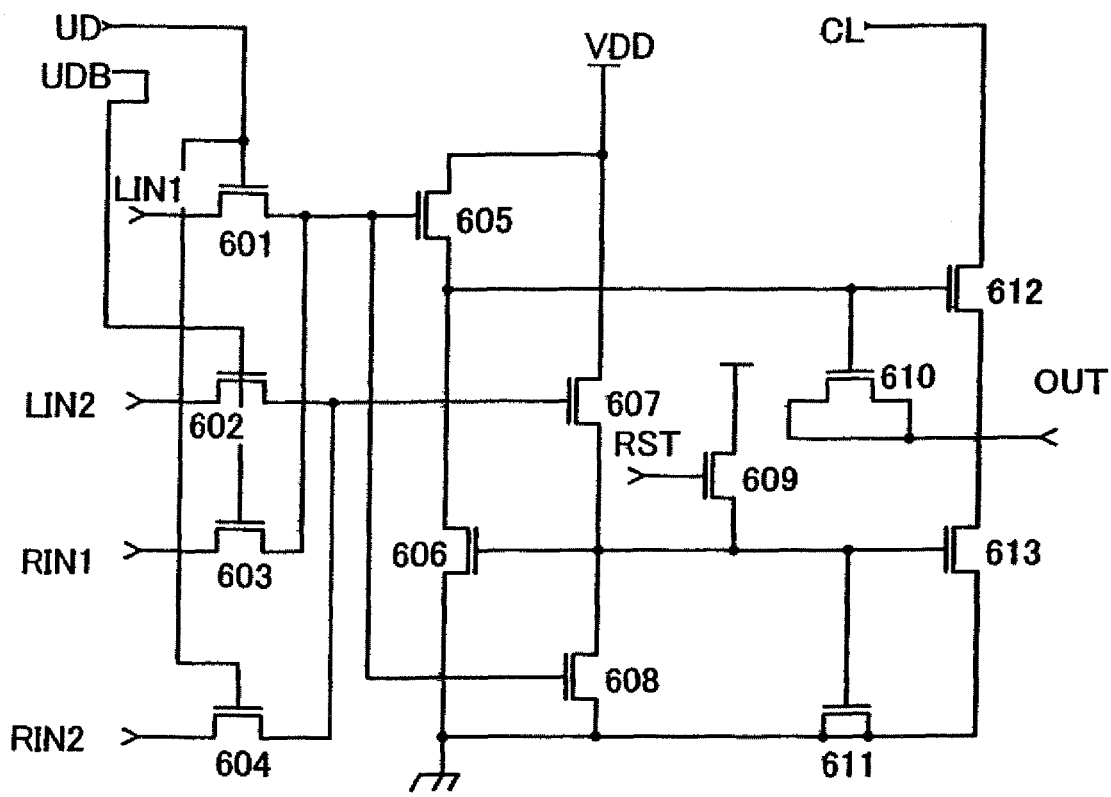
FIG. 23 is a drawing explaining a circuit configuration of the case where a scan line driver circuit of a liquid crystal display device is formed from a TFT (a shift register circuit).

FIG. 23 shows a specific structure of the pulse output circuit 1500, and the circuit is composed of n-channel type TFTs 601 to 613. At this time, the size of the TFTs may be decided in consideration of an operating characteristic of the n-channel type TFTs using an SAS. For example, when a channel length is set to be 8 μm, the channel width can be set ranging from 10 μm to 80 μm.

Figure 24:
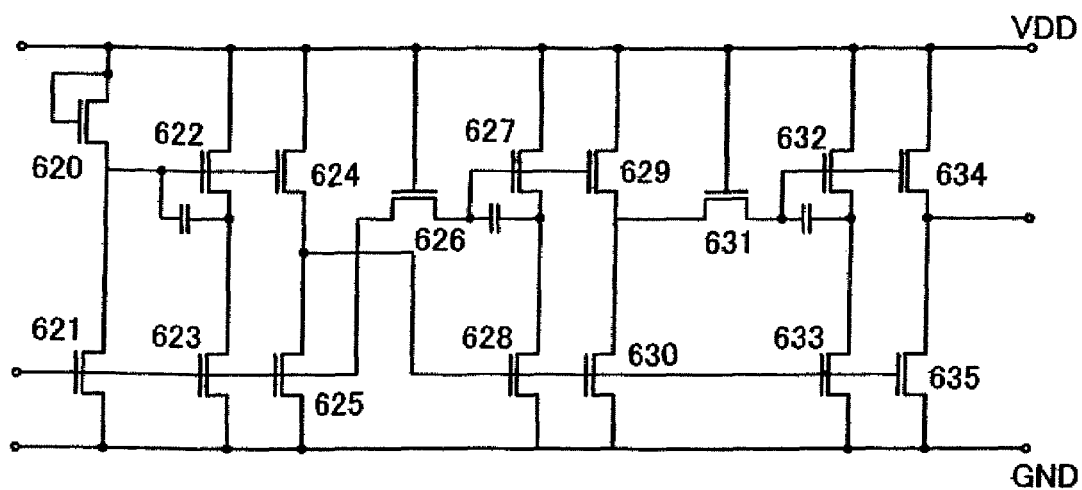
FIG. 24 is a drawing explaining a circuit configuration of the case where a scan line driver circuit of a liquid crystal display device is formed from a TFT (a buffer circuit).

In addition, FIG. 24 shows a specific structure of the buffer circuit 1501. The buffer circuit is composed of n-channel type TFTs 620 to 635 in the same manner. At this time, the size of the TFTs may be decided in consideration of an operating characteristic of the n-channel type TFTs using an SAS. For example, when a channel length is set to be 10 μm, the channel width can be set ranging from 10 μm to 1800 μm.

Figure 18:
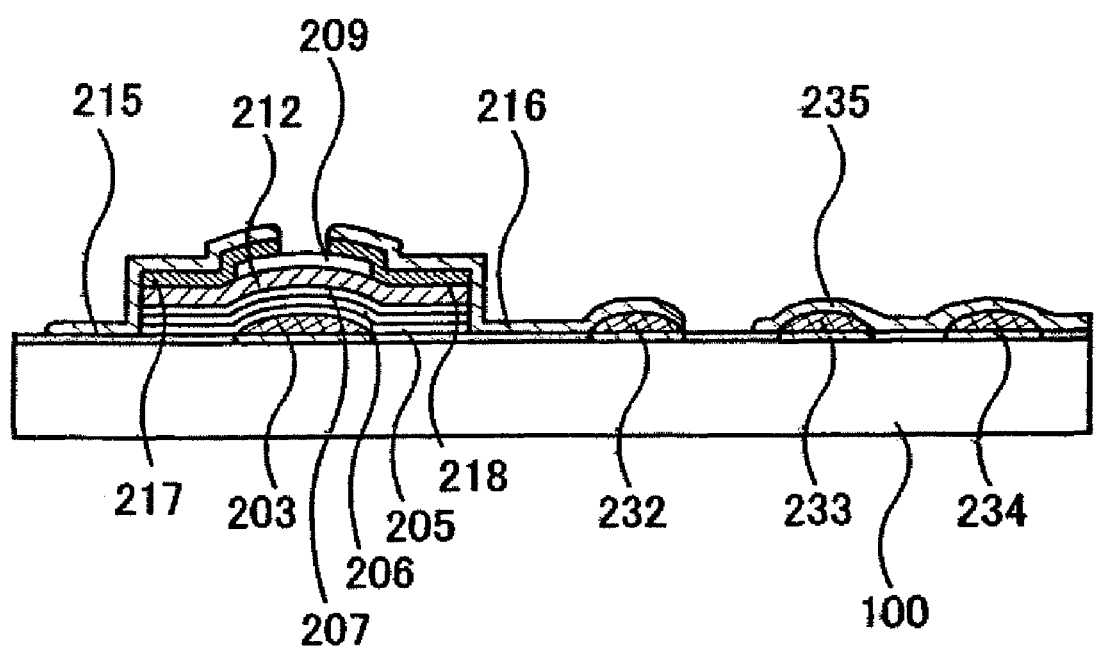
FIG. 18 is a cross-sectional view explaining a manufacturing method of a liquid crystal display device.

It is necessary to connect the TFTs with each other by wirings to realize such a circuit, and FIG. 18 shows a structure example of wirings in the case thereof. As with Embodiment Mode 1, FIG. 18 shows a state in which a gate electrode 203, a gate insulating layer (a stack of three layers of an insulating layer 205 formed of silicon nitride, an insulating layer 206 formed of silicon oxide, and an insulating layer 207 formed of silicon nitride), a semiconductor layer 212 formed from an SAS, an insulating layer 209 which forms a channel protective layer, n-type semiconductor layers 217 and 218 which forms a source and a drain, and wirings 215 and 216 connected to the source and the drain are formed. In this case, connection wirings 232, 233, and 234 are formed over the substrate 100 in the same step as in that of the gate electrode 203. Openings are provided in the gate insulating layer so that the connection wirings 232, 233, and 234 are exposed. Various kinds of circuits can be realized by connecting the TFTs appropriately by the wirings 215 and 216 connected to the source and the drain and a connection wiring 235 formed in the same step.

Embodiment 2

Figure 28:
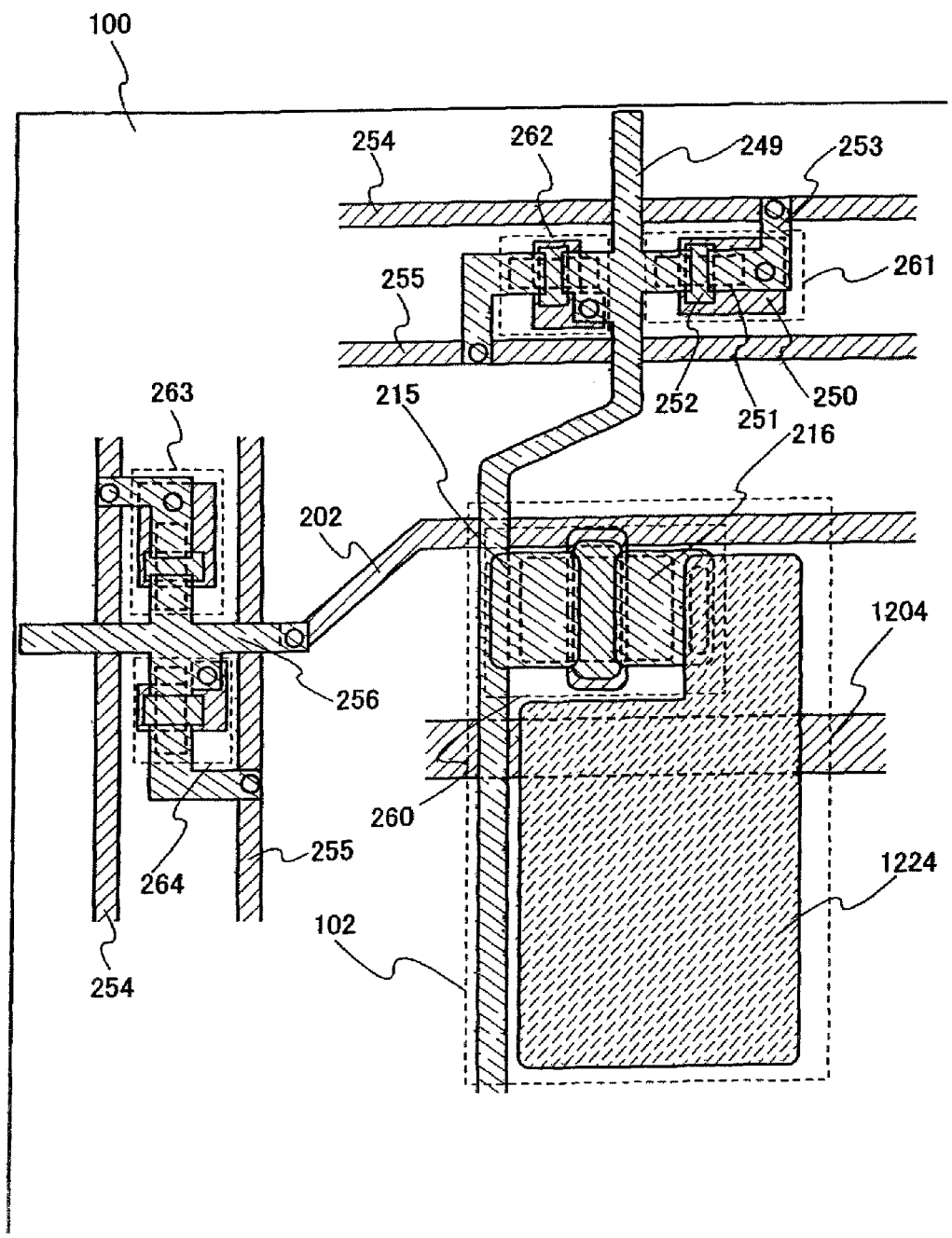
FIG. 28 is a top view showing a liquid crystal display device.

One mode in which protective diodes are provided for a scanning line input terminal portion and a signal line input terminal portion is explained with reference to FIG. 28. A TFT 260 and a capacitor 265 are provided for a pixel 102 in FIG. 28. This TFT has the same structure as that in Embodiment Mode 1. Reference numeral 1224 denotes a pixel electrode, and 1204 denotes a capacitor line.

Figure 29:
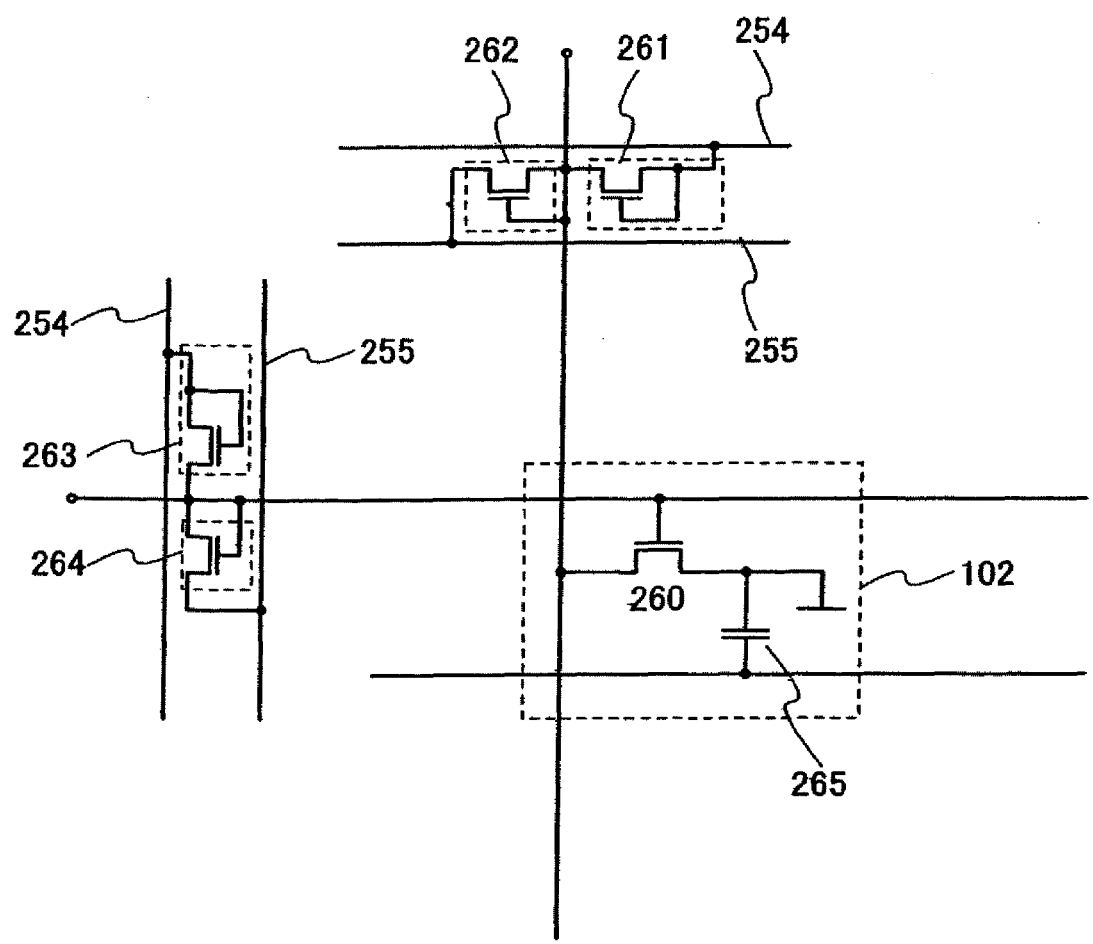
FIG. 29 is an equivalent circuit schematic of a liquid crystal display device shown in FIG. 28.

Protective diodes 261 and 262 are provided for the signal line input terminal portion. These protective diodes are manufactured in the same step as that of the TFT 260 and being operated as a diode by being each connected to a gate and one of a drain or a source. FIG. 29 shows an equivalent circuit diagram such as a top view shown in FIG. 28.

The protective diode 261 includes a gate electrode 250, a semiconductor layer 251, an insulating layer for channel protection 252, and wirings 249 and 253. The protective diode 262 has the same structure. Common potential lines 254 and 255 connecting to this protective diode are formed in the same layer as that of the gate electrode. Therefore, it is necessary to form a contact hole in a gate insulating layer to electrically connect to the wiring 253.

A mask may be formed by a droplet discharge method and etching process may be carried out to form a contact hole in the gate insulating layer. In this case, when etching process by atmospheric pressure discharge is applied, local discharge process is also possible, and it does not need to form a mask over an entire surface of a substrate.

The protective diodes 261 and 262 are formed in the same layer as that of wirings 215 and 216 connected to the source and the drain in the TFT 260 and has a structure in which a wiring 249 connected thereto is connected to a source side or a drain side.

The input terminal portion of the scanning signal line side also has the same structure with protective diodes 263 and 264 and a wiring 256. According to the present invention, the protective diodes provided in an input stage can be formed at the same time. Note that the position of depositing a protective diode is not limited to this embodiment mode and can be also provided between a driver circuit and a pixel as shown in FIG. 3.

Embodiment 3

Next, a mode of mounting a driver circuit on a liquid crystal display device manufactured according to any one of Embodiment Modes 1 to 4 will be described with reference to FIGS. 19 to 21.

Figure 19A:
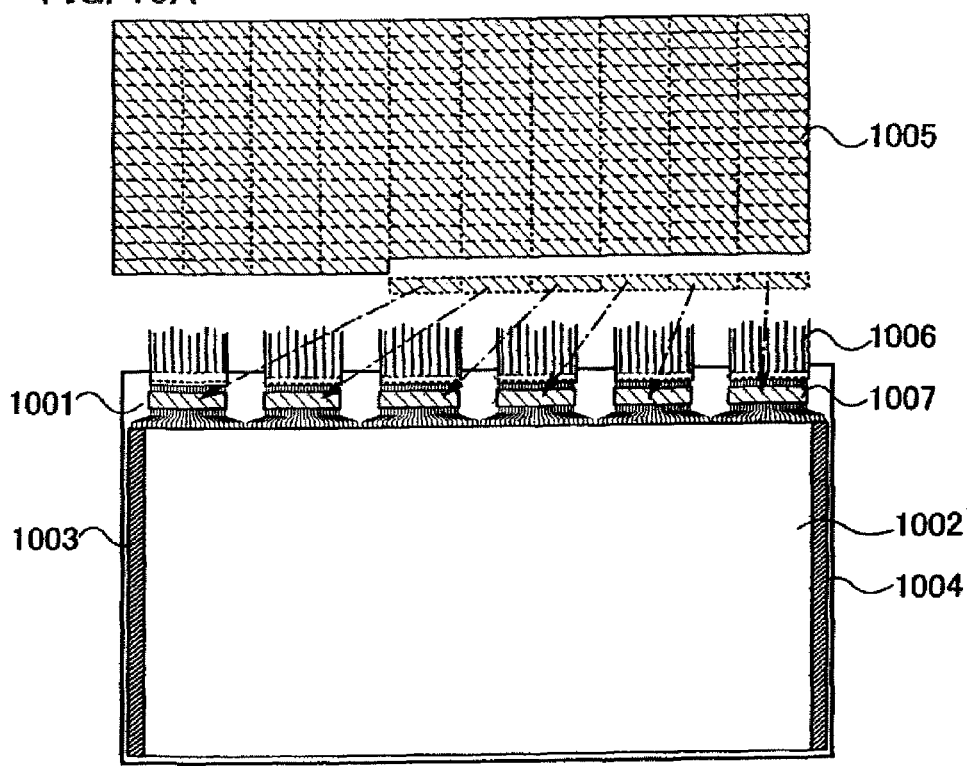
FIGS. 19A and 19B are drawings explaining a mounting method (COG) of a driver circuit of a liquid crystal display device.
Figure 19B:
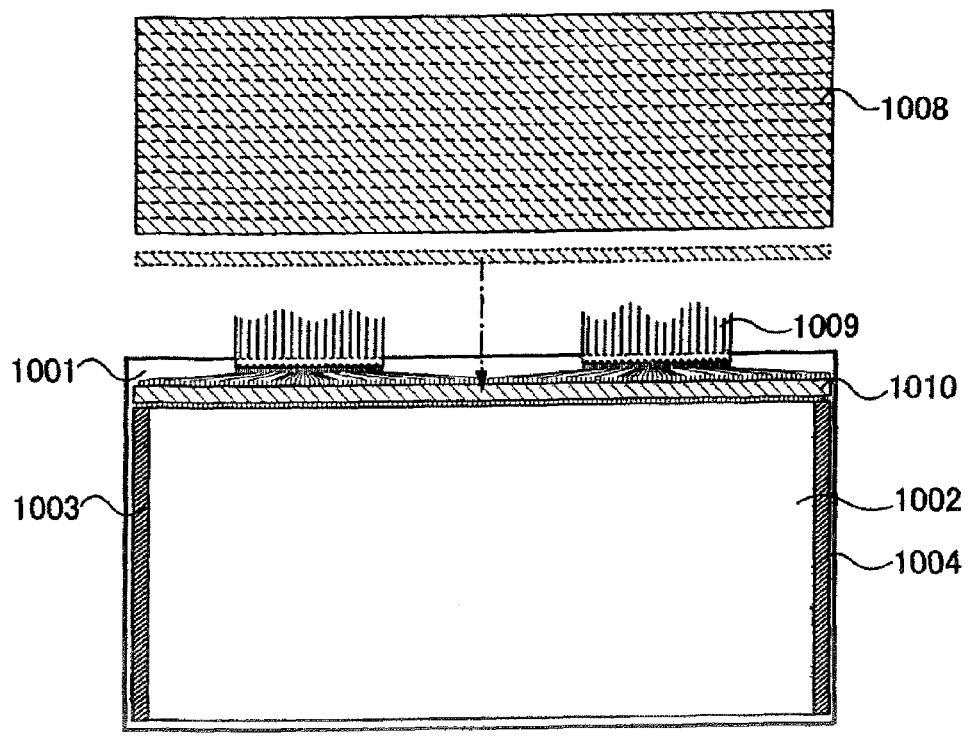

First, a display device using COG is described with reference to FIGS. 19A and 19B. In the display device, a pixel region 1002 that display information such as characters and images and scan line driver circuits 1003 and 1004 are provided over a substrate 1001. Substrates 1005 and 1008 provided with a plurality of driver circuits are separated into rectangular shape. The separated driver circuits (hereinafter, referred to as driver ICs) are attached to the substrate 1001. FIG. 19A shows a plurality of driver ICs 1007, and a tape 1006 is attached to the end of the driver ICs 1007. FIG. 19B shows a driver IC 1010) and a tape 1009 is attached to the end of the driver IC 1010.

Figure 20A:
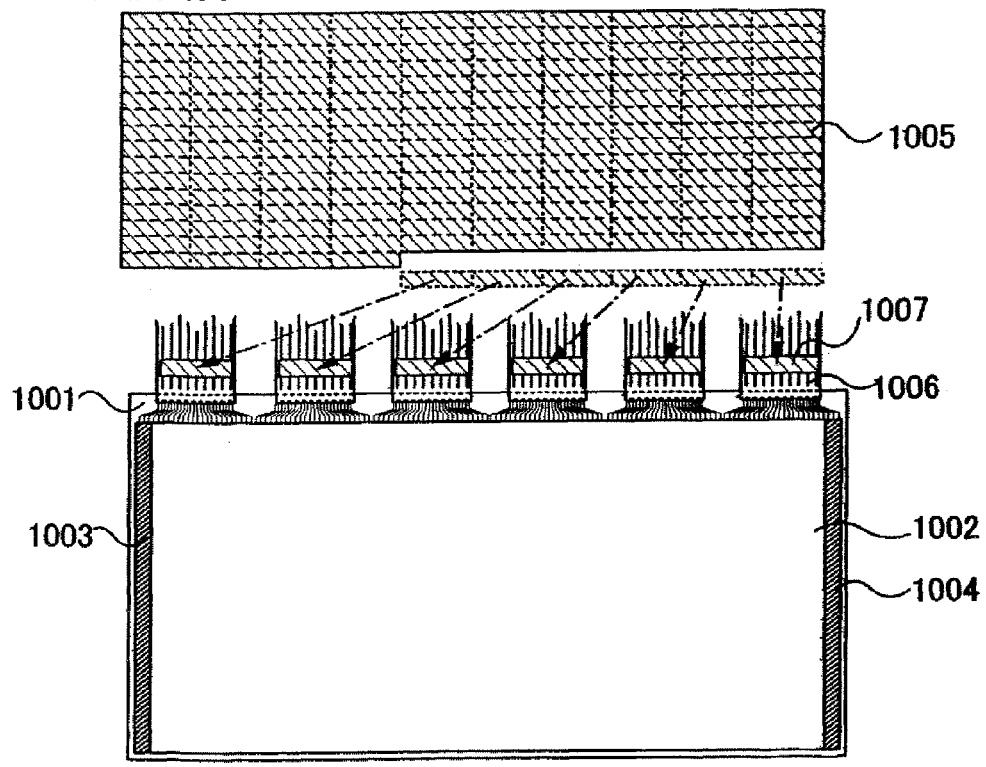
FIGS. 20A and 20B are drawings explaining a mounting method (TAB) of a driver circuit of a liquid crystal display device.
Figure 20B:
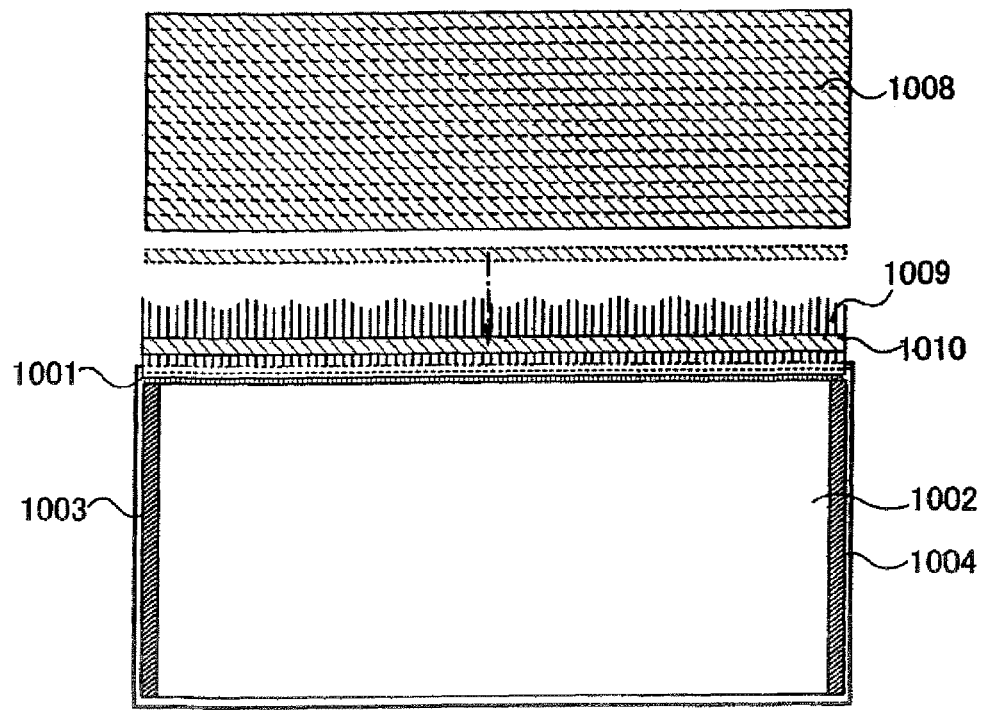

A display device using TAB is described with reference to FIGS. 20A and 208. A pixel region 1002, a scan line driver circuit 1003 and 1004 am provided over the substrate 1001. Here, a plurality of tapes 1006 is pasted on the substrate 1001, and the driver ICs 1007 are attached to the tapes 1006 as in FIG. 20A. In FIG. 20B, a tape 1009 is pasted on the substrate 1001, and the driver IC 1010 is attached to the tape 1009. In the case of adopting the latter, metal pieces or the like that fix the driver IC 1010 may be provided together in respect of intensity.

A plurality of driver ICs for a liquid crystal display device may be mounted on the rectangular substrates 1005 and 1008 having a side of 300 mm to 1000 mm or more in terms of improving productivity.

A plurality of circuit patterns in which a driver circuit portion and an input/output terminal are used as one unit may be formed on the substrates 1005 and 1008, and be divided and taken out finally. As for the length of a long side of the driver IC, a rectangle with a long side of 15 to 80 mm and a short side of 1 to 6 mm may be formed in consideration of a length of one side of a pixel portion or a pixel pitch, as shown in FIGS. 19A and 20A. One side of the pixel portion 1002, or a length of one side of the pixel portion 1002 plus one side of each driver circuit 1003 and 1004 may be employed to form the driver IC, as shown in FIGS. 19B and 20B.

The primacy of the driver IC over an IC chip is the length of the longer side. When a driver IC having a longer side of 15 to 80 mm is used, the number of driver ICs that are necessary for mounting corresponding to the pixel region 1002 is smaller than that of IC chips. Therefore, process yield in manufacturing can be enhanced. When a driver IC is formed on a glass substrate, productivity is not detracted since the driver IC is not limited to a shape of a substrate used as a mother body. This is a great advantage, as compared with the case of taking out IC chips from a circular silicon wafer.

In FIGS. 19A, 19B, 20A and 20B, the driver IC 1007 or 1010 provided with a driver circuit is mounted on a region outside of the pixel region 1002. The driver ICs 1007 and 1010 are signal line driver circuits. In order to form a pixel region corresponding to a RGB full color, 3072 signal lines in a XGA class and 4800 signal lines in a UXGA class are necessary. The described above number of signal lines form a leading out line by dividing into several blocks in an edge of the pixel region 1002 and are gathered in accordance with a pitch of an output terminal of the driver ICs 1007 and 1010.

The driver IC is preferably formed from a crystalline semiconductor formed over a substrate. The crystalline semiconductor is preferable formed by being irradiated with light of a continuous-wave laser. Therefore, a continuous-wave solid state laser or gas laser is used as the oscillator for emitting the laser light. There is few crystal defects when a continuous-wave laser is used. As a result, a transistor can be manufactured by using a polycrystalline semiconductor film with a large grain size. In addition, high-speed driving is possible since mobility or a response speed is favorable, and it is possible to further improve an operating frequency of an element than that of the conventional element; therefore, high reliability can be obtained since there is few properties variations. Note that a channel-length direction of a transistor may be same as a scanning direction of laser light to further improve an operating frequency. This is because the highest mobility can be obtained when a channel length direction of a transistor and a scanning direction of laser light with respect to a substrate are almost parallel (preferably, from −30° to 30°) in a step of laser crystallization by a continuous-wave laser. A channel length direction is same as a flowing direction of current in a channel formation region, in other words, a direction in which an electric charge moves. The thus formed transistor has an active layer including a polycrystalline semiconductor film in which a crystal grain is extended in a channel direction, and this means that a crystal grain boundary is formed almost along a channel direction.

In carrying out laser crystallization, it is preferable to narrow down the laser light largely, and a beam spot thereof preferably has a width of approximately from 1 mm to 3 mm which is the same as that of a shorter side of the driver IC. In addition, in order to ensure an adequate and effective energy density for an object to be irradiated, an irradiated region of the laser light is preferably a linear shape. However, a linear shape here does not refer to a line in a proper sense, but refers to a rectangle or an oblong with a large aspect ratio. For example, the linear shape refers to a rectangle or an oblong with an aspect ratio of 2 or more (preferably from 10 to 10000). Accordingly, productivity can be improved by making a width of a beam spot of the laser light and that of a shorter side of the driver IC even.

In FIGS. 19A and 19B and FIGS. 20A and 20B, a mode in which the scanning line driver circuit is integrally formed with the pixel portion and the driver IC is mounted as a signal line driver circuit is shown. However, this embodiment mode is not limited to this mode, and the driver IC may be mounted as both a scanning line driver circuit and a signal line driver circuit. In that case, it is preferable to make specifications of the driver ICs to be used on the scanning line side and the signal line side different.

In the pixel region 1002, the signal lines and the scanning lines are intersected to form a matrix and a transistor is arranged in every intersection portion. A TFT having a channel portion formed from an amorphous semiconductor or a semi-amorphous semiconductor can be used as the transistor arranged in the pixel portion 1002, according to one aspect of the invention. An amorphous semiconductor is formed by a plasma CVD method, a sputtering method or the like. It is possible to form a semi-amorphous semiconductor at a temperature of 300° C. or less with plasma CVD. A film thickness necessary to form a transistor is formed in a short time even in the case of a non-alkaline glass substrate of an external size of, for example, 550 mm×650 mm. The feature of such a manufacturing technique is effective in manufacturing a display device of a large-sized screen. In addition, a semi-amorphous TFT can obtain an electron field-effect mobility of 1 to 15 $cm^2/V \cdot sec$ by forming a channel region from SAS. The TFT can be used as a switching element of a pixel or an element forming a scanning line driver circuit. Therefore, an EL display panel realizing a system-on-panel can be manufactured.

FIGS. 19A to 20B show the case under the condition that each TFT having a semiconductor film formed of an SAS so that a scan line driver circuit is integrally formed over a substrate as in Embodiment Mode 3. In the case of using a TFT having a semiconductor layer formed of an AS, both scan line driver circuit and signal line driver circuit may be mounted as driver ICs.

In that case, it is preferable to differentiate a specification of the driver ICs to be used between the scanning line and signal line side. For example, a withstand pressure of around 30 V is required for the transistor composing the scanning line driver ICs; however, a drive frequency is 100 kHz or less and a high speed operation is comparatively not required. Therefore, it is preferable to set a sufficiently long channel-length (L) of the transistor composing the scanning line driver. On the other hand, a withstand pressure of around 12 V is enough for the transistor of the signal line driver ICs; however, a drive frequency is around 65 MHz at 3 V and a high speed operation is required. Therefore, it is preferable to set a channel-length or the like of the transistor composing a driver with a micron rule.

Figure 21A:
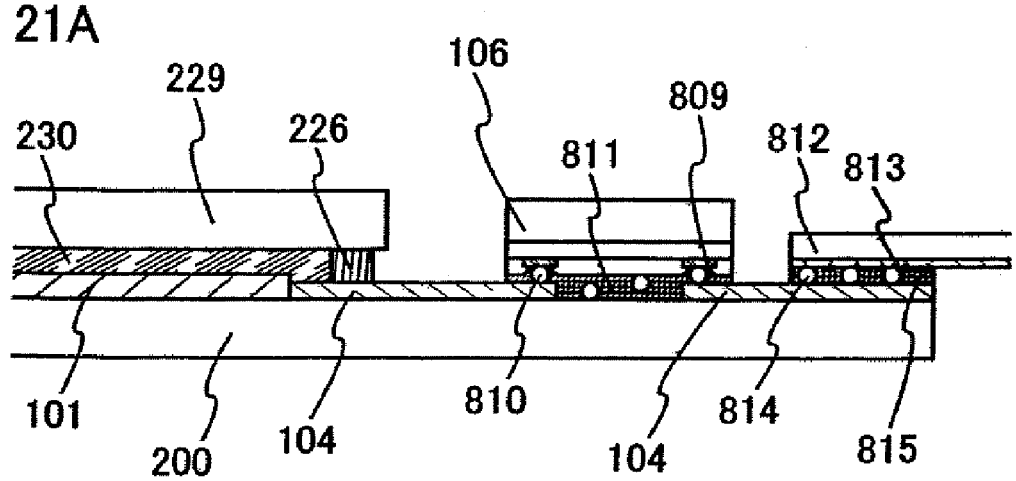
FIGS. 21A and 21B are drawings explaining a mounting method (COG) of a driver circuit of a liquid crystal display device.
Figure 21B:
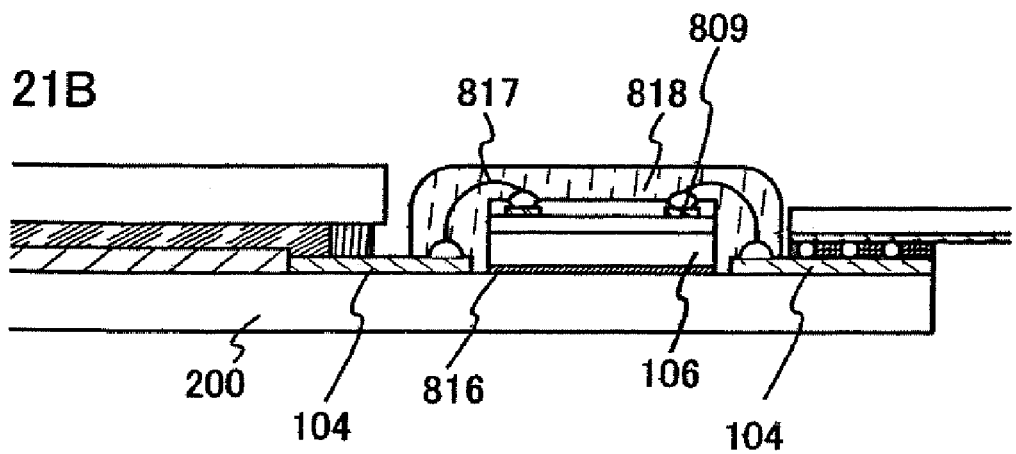

FIGS. 21A and 21B show a structure in which a driver IC is mounted by COG in the case of a liquid crystal display device in FIG. 2. FIG. 21A shows a structure in which a driver IC 106 is mounted on a TFT substrate 200 with the use of an anisotropic conductive material. A pixel portion 101, a signal line input terminal 104 (same in the case of a scan line driver circuit 103) are provided over the TFT substrate 200. A counter substrate 229 is pasted to the TFT substrate 200 with a sealant 226. A liquid crystal layer 230 is formed between the substrates.

An FPC 812 is attached to the signal line input terminal 104 with the use of an anisotropic conductive material. The anisotropic conductive material includes a resin 815 and conductive particles 814 each of whose surfaces is plated with Au or the like and of which diameter is tens to hundreds of μm. With the conductive particles 214, the signal line input terminal 104 is electrically connected to a wiring 813 formed in the FPC 812. The driver IC 106 is also attached to the TFT substrate 200 with an anisotropic conductive material. With conductive particles 810 included in a resin 811, an input-output terminal 809 provided in the driver IC 106 is electrically connected to the signal line input terminal 104.

As shown in FIG. 21B, a driver IC 106 is fixed to the TFT substrate 200 with an adhesive 816, and the input-output terminal 809 of the driver IC may be connected to the signal line input terminal 104 with an Au wire 817. Then, a sealer resin 818 is used here for sealing. There is no limitation on a mounting method of the driver IC, and a known method such as COG, wire bonding, or TAB may be used.

The driver IC is formed to have the same thickness as that of the counter substrate. Accordingly, they can have almost the same height, which results in a thin display device as a whole. In addition, each substrate is formed of one material; therefore, thermal stress is not generated even when the temperature in the display device is changed, and thus properties of the circuit comprising TFTs are not damaged. Moreover, as shown in this embodiment, a driver circuit is mounted with a driver IC that is longer than an IC chip so that the number of driver ICs to be mounted on a pixel area can be reduced.

As described above, a driver circuit can be mounted on a liquid crystal display device.

Embodiment 4

Figure 25:
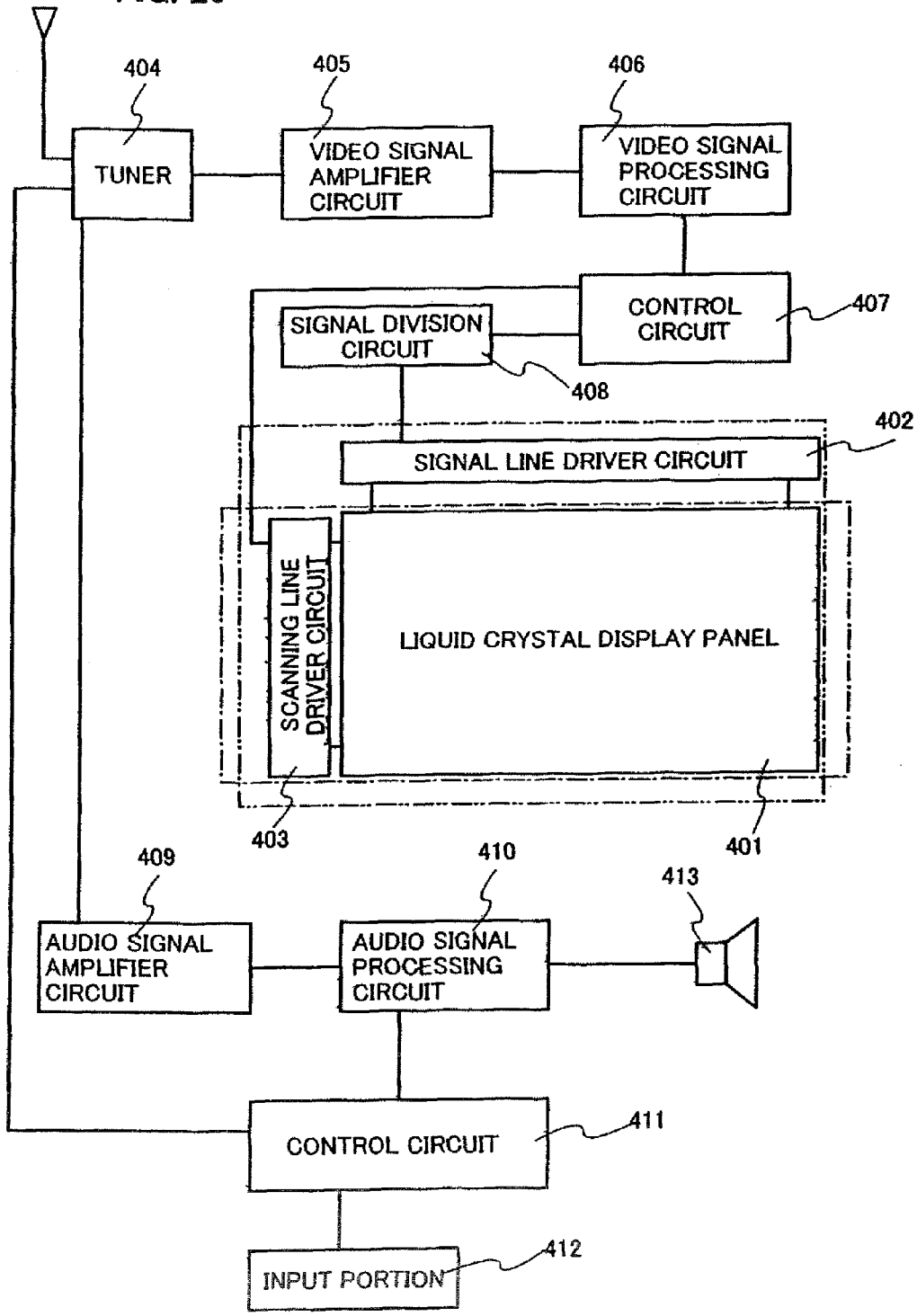
FIG. 25 is a block diagram showing a main structure of a liquid crystal television.

A liquid crystal television receiver can be completed by a liquid crystal display device manufactured according to Embodiment Modes 1 to 4. FIG. 25 shows a block diagram of a main structure of the liquid crystal television receiver. As a structure shown in FIG. 1, there is the case where a scanning line driver circuit 403 and a signal line driver circuit 402 are mounted by a TAB method by forming only a pixel portion 401. As a structure shown in FIG. 2, the scanning line driver circuit 403 and the signal line driver circuit 402 are mounted on the pixel area 401 and a periphery thereof by a COG method. As shown in FIG. 3, there is the case where a TFT is formed from an SAS, and the signal line driver circuit 402 is separately mounted as a driver IC by integrally forming the pixel area 401 and the scanning line driver circuit 403 over a substrate. However, any one of modes may be applied.

As another structure of an external circuit, in an input side of a video signal, a tuner 404, a video signal amplifier circuit 405 that amplifies a video signal received from the tuner; a video signal processing circuit 406 that converts signal outputted therefrom into a color signal corresponding to each color of red, green, and blue; a control circuit 407 for converting the video signal into an input specification of a driver IC; or the like are provided. The control circuit 407 outputs a signal into the scanning line side and the signal line side, respectively. In the case of digital driving, a signal division circuit 408 is provided on the signal line side and may have a structure in which an input digital signal is provided by dividing into m-pieces.

In signals received by the tuner 404, an audio signal is transmitted to an audio signal amplifier circuit 409, and the output thereof is provided for a speaker 413 through an audio signal processing circuit 410. A control circuit 411 receives control information of a receiving station (a receiving frequency) or sound volume from an input portion 412 and transmits a signal to the tuner 404 or the audio signal processing circuit 410.

Figure 26:
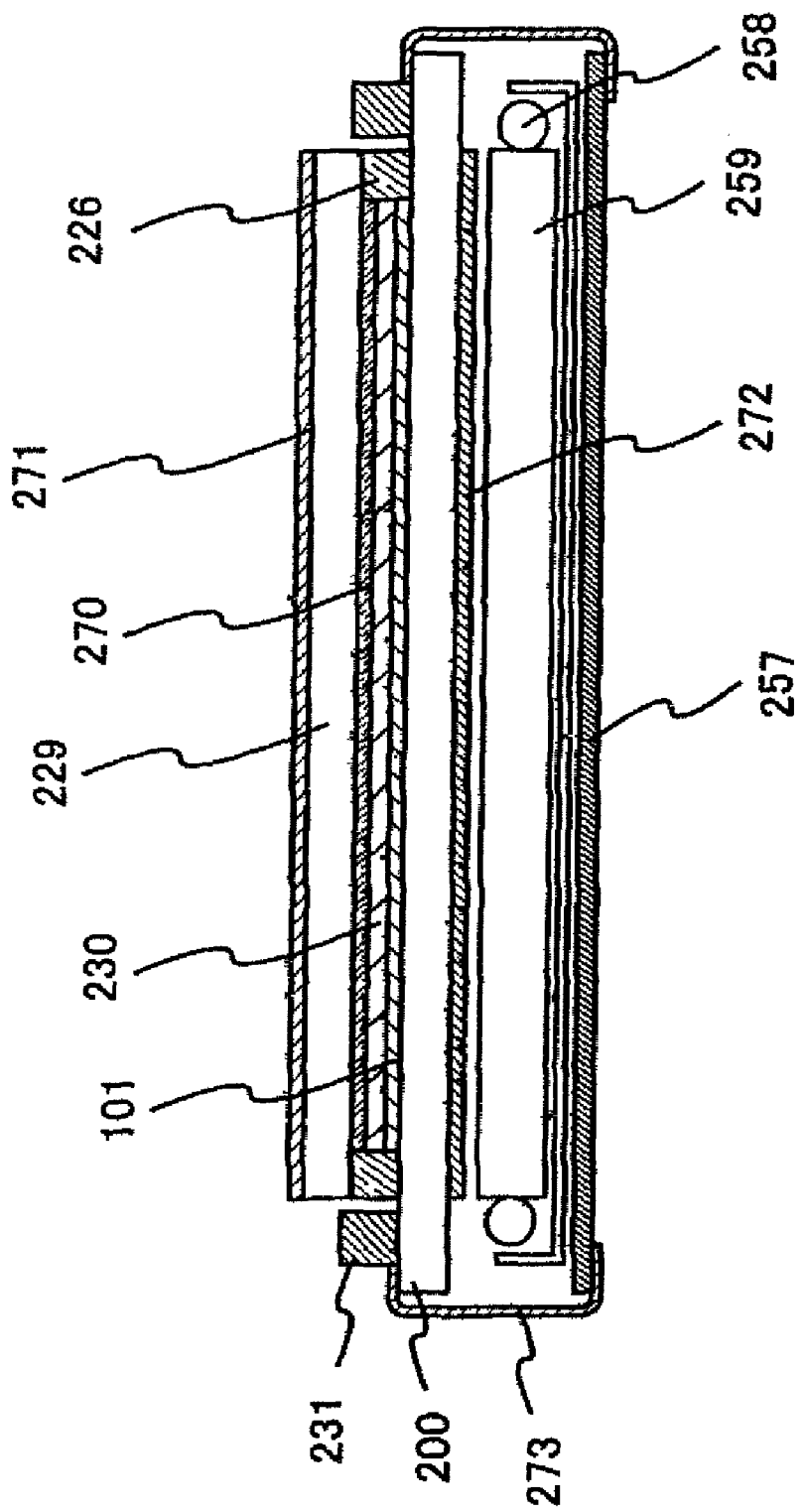
FIG. 26 is a drawing explaining a structure of a liquid crystal display module.

FIG. 26 is an example of a liquid crystal display module. A TFT substrate 200 and a counter substrate 229 are fixed with a sealant 226, and a pixel portion 101 and a liquid crystal layer 230 are provided therebetween to form a display region. A colored layer 270 is needed in carrying out color display. In the case of RGB system, the colored layer 270 corresponding to each color of red, green, and blue is provided corresponding to each pixel. Polarizing plates 271 and 267 are provided outside of the TFT substrate 200 and the opposite substrate 229. Light source is composed of a cold cathode tube 258 and a light conducting plate 259, and a circuit board 257 is connected to the TFT substrate 200 by a flexible printed board 273 and a terminal 231, and an external circuit such as a control circuit or a power supply circuit are incorporated.

Figure 27:
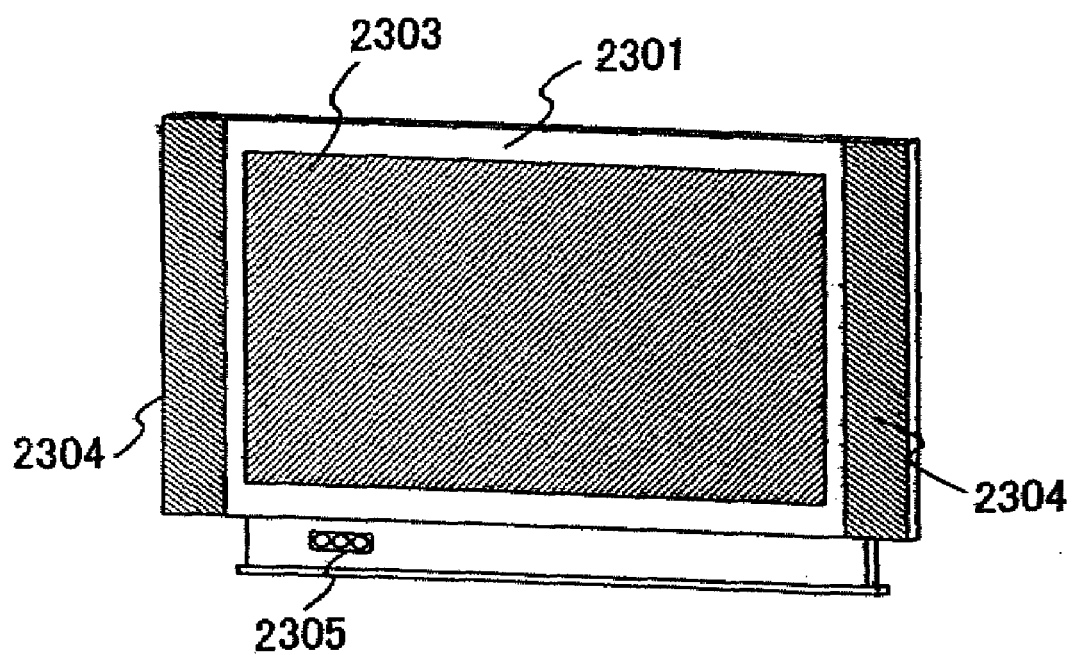
FIG. 27 is a drawing explaining structure of a television receiver completed according to the invention.

FIG. 27 shows a state in which the television receiver is completed by incorporating this liquid crystal display module into a case 2301 A display screen 2303 is formed by the liquid crystal display module, and a speaker 2304, operation switches 2305, and the like are provided as other attached equipment. Accordingly, the television receiver can be completed according to the present invention.

Of course, a liquid crystal display device of the invention is not limited to the television receiver and is applicable to a display medium such as an information display board at a station, an airport, a display of a cellular phone, or the like, or an advertisement display board on the street as well as a monitor of a personal computer.

What is claimed is:

1. A method for manufacturing a display device, comprising the steps of:
   selectively forming a gate electrode by a droplet discharge method over a substrate;
   forming a gate insulating layer over the gate electrode;
   forming a first semiconductor layer over the gate insulating layer;
   selectively forming a channel protective layer by a droplet discharge method over an area which is overlapped with the gate electrode over the first semiconductor layer;
   forming a second semiconductor layer containing an impurity having one conductivity type over the first semiconductor layer and the channel protective layer;
   selectively forming a first mask layer over the second semiconductor layer;
   etching the first semiconductor layer, the second semiconductor layer, and the gate insulating layer with the use of the first mask layer;
   selectively forming a first insulating layer by a droplet discharge method over the gate electrode;
   selectively forming source and drain wirings by a droplet discharge method;
   etching the second semiconductor layer over the channel protective layer;
   forming a passivation film over an entire surface of the substrate;
   selectively forming a second insulating layer over the passivation film by a droplet discharge method;
   etching the passivation film over the drain wiring; and
   forming a transparent conductive film over the second insulating layer so as to connect to the drain wiring.

2. A method according to claim 1, wherein the steps of forming the gate insulating layer and forming the first semiconductor layer is continuously performed without exposure to an atmosphere.

3. A method according to claim 1, wherein the gate insulating layer is formed with a laminate in which a silicon nitride film, a silicon oxide film, and a silicon nitride film are formed in order.

4. A method according to claim 1, wherein the second semiconductor layer, the first semiconductor layer, and the gate insulating layer are etched with the use of the first mask layer; thus, an end of the first semiconductor is provided so as not to protrude from an end of the gate insulating layer.

5. A method according to claim 1, wherein the display device is a liquid crystal display device.

6. A method for manufacturing a display device, comprising the steps of:
   selectively forming a gate electrode by a droplet discharge method over a substrate;
   forming a gate insulating layer over the gate electrode;
   forming a first semiconductor layer over the gate insulating layer;
   selectively forming a channel protective layer by a droplet discharge method over an area which is overlapped with the gate electrode over the first semiconductor layer;
   forming a second semiconductor layer containing an impurity having one conductivity type over the first semiconductor layer and the channel protective layer;
   selectively forming a first mask layer over the second semiconductor layer;
   etching the first semiconductor layer, the second semiconductor layer, and the gate insulating layer with the use of the first mask layer;
   selectively forming a first insulating layer by a droplet discharge method over the gate electrode;
   selectively forming source and drain wirings by a droplet discharge method;
   etching the second semiconductor layer over the channel protective layer with the use of the source and drain wirings as masks;
   forming a passivation film over an entire surface of the substrate;
   selectively forming a second insulating layer by a droplet discharge method over the passivation film;
   etching the passivation film over the drain wiring with the use of the second insulating layer as masks; and
   forming a transparent conductive film over the second insulating layer so as to connect to the drain wiring.

7. A method according to claim 6, wherein the steps of forming the gate insulating layer and forming the first semiconductor layer is continuously performed without exposure to an atmosphere.

8. A method according to claim 6, wherein the gate insulating layer is formed with a laminate in which a silicon nitride film, a silicon oxide film, and a silicon nitride film are formed in order.

9. A method according to claim 6, wherein the second semiconductor layer, the first semiconductor layer, and the gate insulating layer are etched with the use of the first mask layer; thus, an end of the first semiconductor is provided so as not to protrude from an end of the gate insulating layer.

10. A method according to claim 6, wherein the display device is a liquid crystal display device.

11. A method for manufacturing a display device, comprising the steps of:
   forming an adhesion improving layer comprising one of a metal material and a metal oxide material over and in contact with a substrate;
   selectively forming a gate electrode by a droplet discharge method over and in contact with the adhesion improving layer;
   insulating the adhesion improving layer not overlapping with the gate electrode;
   forming a gate insulating layer over the gate electrode;

forming a first semiconductor layer over the gate insulating layer;

selectively forming a channel protective layer by a droplet discharge method over an area which is overlapped with the gate electrode over the first semiconductor layer;

forming a second semiconductor layer containing an impurity having one conductivity type over the first semiconductor layer and the channel protective layer;

selectively forming a first mask layer over the second semiconductor layer;

etching the first semiconductor layer, the second semiconductor layer, and the gate insulating layer with the use of the first mask layer;

selectively forming a first insulating layer by a droplet discharge method over the gate electrode;

selectively forming source and drain wirings by a droplet discharge method;

etching the second semiconductor layer over the channel protective layer;

forming a passivation film over an entire surface of the substrate;

selectively forming a second insulating layer over the passivation film by a droplet discharge method;

etching the passivation film over the drain wiring; and forming a transparent conductive film over the second insulating layer so as to connect to the drain wiring.

12. A method according to claim 11, wherein the steps of forming the gate insulating layer and forming the first semiconductor layer is continuously performed without exposure to an atmosphere.

13. A method according to claim 11, wherein the gate insulating layer is formed with a laminate in which a silicon nitride film, a silicon oxide film, and a silicon nitride film are formed in order.

14. A method according to claim 11, wherein the second semiconductor layer, the first semiconductor layer, and the gate insulating layer are etched with the use of the first mask layer; thus, an end of the first semiconductor is provided so as not to protrude from an end of the gate insulating layer.

15. A method according to claim 11, wherein the display device is a liquid crystal display device.

* * * * *